US 12,225,800 B2

(12) United States Patent
Kim et al.

(10) Patent No.: US 12,225,800 B2
(45) Date of Patent: Feb. 11, 2025

(54) DISPLAY PANEL AND ELECTRONIC DEVICE INCLUDING THE SAME

(71) Applicant: SAMSUNG ELECTRONICS CO., LTD., Suwon-si (KR)

(72) Inventors: Tae Gon Kim, Hwaseong-si (KR); Shin Ae Jun, Seongnam-si (KR); Deukseok Chung, Yongin-si (KR); Garam Park, Seoul (KR); Sung Hun Lee, Hwaseong-si (KR); Byoung Ki Choi, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 515 days.

(21) Appl. No.: 17/686,934

(22) Filed: Mar. 4, 2022

(65) Prior Publication Data

US 2022/0285445 A1    Sep. 8, 2022

(30) Foreign Application Priority Data

Mar. 4, 2021    (KR) .................. 10-2021-0029084

(51) Int. Cl.
| | | |
|---|---|---|
| *H10K 59/38* | (2023.01) | |
| *B82Y 20/00* | (2011.01) | |
| *B82Y 40/00* | (2011.01) | |
| *C09K 11/02* | (2006.01) | |
| *C09K 11/08* | (2006.01) | |

(Continued)

(52) U.S. Cl.
CPC .............. *H10K 59/38* (2023.02); *C09K 11/02* (2013.01); *C09K 11/0883* (2013.01);
(Continued)

(58) Field of Classification Search
CPC .... H10K 59/38; H10K 50/131; H10K 59/124; H10K 2102/331; H10K 50/13;
(Continued)

(56) References Cited

U.S. PATENT DOCUMENTS 10,240,087 B2    3/2019    Vick et al.
10,381,527 B2    8/2019    Vick et al.
(Continued)

FOREIGN PATENT DOCUMENTS

KR    2007000807 A    1/2007
KR    20070008071 A    1/2007
(Continued)

OTHER PUBLICATIONS

Jung-Ho Jo, High-efficiency red electroluminescent device based on multishelled InP quantum dotset al., Opt. Lett., vol. 41, No. 17, pp. 3984-3987.

(Continued)

*Primary Examiner* — Thanh T Nguyen
(74) *Attorney, Agent, or Firm* — CANTOR COLBURN LLP

(57) ABSTRACT

A display panel may include a light emitting panel, and a color conversion panel. The light emitting panel is configured to emit incident light including a first light and a second light, a luminescent peak wavelength of the first light may be greater than or equal to about 450 nm and less than or equal to about 480 nm and a luminescent peak wavelength of the second light may be greater than or equal to about 500 nm and less than or equal to about 580 nm. The color conversion panel includes a color conversion layer including a conversion region, and optionally, a partition wall defining each region of the color conversion panel. The color conversion region includes a first region corresponding to a red pixel, and the first region include a first composite including a matrix and a plurality of luminescent nanostructures dispersed in the matrix, and in the UV-Vis absorption spectrum, an absorbance ratio at a wavelength of 520 nm with respect to a wavelength of 350 nm may be greater than or equal to about 0.04:1.

25 Claims, 13 Drawing Sheets

(51) Int. Cl.
  *C09K 11/88* (2006.01)
  *H10K 50/13* (2023.01)
  *H10K 59/124* (2023.01)
  *H10K 102/00* (2023.01)
(52) U.S. Cl.
  CPC .......... *C09K 11/883* (2013.01); *H10K 50/131* (2023.02); *B82Y 20/00* (2013.01); *B82Y 40/00* (2013.01); *H10K 59/124* (2023.02); *H10K 2102/331* (2023.02)
(58) Field of Classification Search
  CPC .... H10K 59/35; H10K 85/341; H10K 85/381; C09K 11/02; C09K 11/0883; C09K 11/883; C09K 11/06; C09K 11/70; B82Y 20/00; B82Y 40/00; G02B 5/201
  See application file for complete search history.

(56) References Cited

U.S. PATENT DOCUMENTS

| | | | |
|---|---|---|---|
| 10,692,417 | B2 | 6/2020 | Lee et al. |
| 10,833,228 | B2 | 11/2020 | Vick et al. |
| 2017/0090223 | A1* | 3/2017 | Kim ...................... G02F 1/1309 |
| 2018/0374409 | A1 | 12/2018 | Lee et al. |
| 2019/0211261 | A1* | 7/2019 | Jang ...................... C08F 220/06 |
| 2020/0172806 | A1* | 6/2020 | Park ...................... H10K 50/115 |
| 2020/0216755 | A1* | 7/2020 | Jang ...................... H10K 59/38 |
| 2020/0251040 | A1 | 8/2020 | Lee et al. |
| 2020/0399536 | A1 | 12/2020 | Kim et al. |

FOREIGN PATENT DOCUMENTS

| | | |
|---|---|---|
| KR | 20160053974 A | 5/2016 |
| KR | 20170096583 A | 8/2017 |
| KR | 20190000759 A | 1/2019 |
| WO | 10023603 A2 | 3/2010 |

OTHER PUBLICATIONS

Yuanyuan Li, et al., A Novel QD-OLED Structure of High Optical Efficiency, ICDT 2019., vol. 50, Issue. S1, Session. 10, 3pp.

Yu-Ho Won, et al., Highly efficient and stable InP/ZnSe/ZnS quantum dot light-emitting diodes, Nature., Published online: Nov. 27, 2019, vol. 575, No. 634-638.

* cited by examiner

Pattern Preparation by using a photoresist

Repeating the Patterning Process three times

DISPLAY PANEL AND ELECTRONIC DEVICE INCLUDING THE SAME

CROSS-REFERENCE TO RELATED APPLICATION

This application claims priority to Korean Patent Application No. 10-2021-0029084, filed in the Korean Intellectual Property Office on Mar. 4, 2021, and all the benefits accruing therefrom under 35 U.S.C. § 119, the content of which in its entirety is herein incorporated by reference.

BACKGROUND

1. Field

A display panel and an electronic device including the same disclosed.

2. Description of the Related Art

A nanostructure such as a quantum dot may show different aspects, characteristics, or properties than a corresponding bulk material having substantially the same composition, for example, in terms of some of the physical properties of the nanostructure (e.g., a bandgap energy, a luminescent property, and the like), which are known to be intrinsic in the bulk material. A luminescent nanostructure(s) may be configured to emit light on excitation by an energy such as an incident light or an applied voltage. In a light emitting device, quantum dots, which are luminescent nanostructures, are typically positioned in a form of a quantum dot composite. The luminescent nanostructure may find applicability in a variety of devices (e.g., a display panel or an electronic device including the display panel).

SUMMARY

An embodiment provides a display panel including a color conversion panel including a luminescent nanostructure(s).

An embodiment provides an electronic device including the display panel.

In an embodiment, a display panel may include a light emitting panel, and a color conversion panel with a surface opposite a surface of the light emitting panel (e.g., the color conversion panel faces the light emitting panel),
  wherein the light emitting panel is configured to emit incident light including a first light with a luminescent peak wavelength greater than or equal to about 450 nm and less than or equal to about 480 nm, and a second light with a luminescent peak wavelength greater than or equal to about 500 nm and less than or equal to about 580 nm,
  wherein the color conversion panel includes a color conversion layer including a color conversion region, and optionally, a partition wall defining each region of the color conversion layer,
  wherein the color conversion region includes a first region corresponding to a red pixel, and the first region includes a first composite including a matrix and a plurality of luminescent nanostructures dispersed in the matrix, (for example, the plurality of luminescent nanostructures being configured to convert an emission spectrum of the incident light),
  wherein a UV-Vis absorption spectrum of the plurality of the luminescent nanostructures includes a first absorption peak in a range of greater than or equal to about 580 nm and less than or equal to about 630 nm, and
  wherein in the UV-Vis absorption spectrum, an absorbance ratio at a wavelength of about 520 nm with respect to a wavelength of about 350 nm may be greater than or equal to about 0.04:1.

The light emitting panel may include a first electrode and a second electrode, and a light emission layer disposed between the first electrode and the second electrode.

The light emission layer may include an organic compound and a dopant.

The light emission layer may include a first emission layer(s) and a second emission layer(s) disposed on the first emission layer.

The first emission layer may be configured to emit the first light.

The second emission layer may be configured to emit the second light.

The light emission layer may further include a first charge generation layer disposed between the first emission layer and the second emission layer.

The light emitting panel may further include a charge auxiliary layer disposed between the first electrode and the first emission layer, between the second electrode and the second emission layer, or between the first electrode and the first emission layer and between the second electrode and the second emission layer.

In the emission layer, a second emission layer may be disposed between two first (adjacent) emission layers.

In the emission layer, a first emission layer may be disposed between two second (adjacent) emission layers.

The incident light may not include red light having a wavelength of from about 600 nm and to about 680 nm.

The incident light may include green light (e.g., the second light) and blue light (the first light).

A (maximum) luminescent peak wavelength of the second light may be in a range of greater than or equal to about 515 nm and less than or equal to about 530 nm. A (maximum) luminescent peak wavelength of the first light may be in a range of greater than or equal to about 455 nm and less than or equal to about 465 nm.

A (maximum) luminescent peak wavelength of the luminescent nanostructures may be in a range of greater than or equal to about 600 nm and less than or equal to about 660 nm.

In the UV-Vis absorption spectrum of the luminescent nanostructures, an absorbance ratio at a wavelength of about 520 nm with respect to a wavelength of about 350 nm may be greater than or equal to about 0.045:1.

The plurality of the luminescent nanostructures may include a first semiconductor nanocrystal including a Group III-V compound and a second semiconductor nanocrystal including a zinc chalcogenide.

The Group III-V compound may include indium and phosphorus.

The zinc chalcogenide may include zinc, selenium, and sulfur.

The luminescent nanostructures or the first composite may not include cadmium.

In the plurality of the luminescent nanostructures, a mole ratio of zinc to indium may be greater than or equal to about 7.5:1, greater than or equal to about 8:1, greater than or equal to about 9:1, or greater than or equal to about 10:1 and less than or equal to about 13:1, less than or equal to about 12.4:1, or less than or equal to about 11:1.

In the plurality of the luminescent nanostructures, a mole ratio of indium to a sum of sulfur and selenium may be greater than or equal to about 0.05:1, greater than or equal to about 00.06:1, greater than or equal to about 0.07:1, greater than or equal to about 0.09:1, or greater than or equal to about 0.096:1 and less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.15:1, less than or equal to about 0.11:1, or less than or equal to about 0.109:1.

In the plurality of the luminescent nanostructures, a mole ratio of indium to a sum of sulfur and selenium may be greater than or equal to about 0.09:1, or greater than or equal to about 0.096:1. In the plurality of the luminescent nanostructures, a mole ratio of indium to a sum of sulfur and selenium may be less than or equal to about 0.23:1, or less than or equal to about 0.109:1.

In the plurality of the luminescent nanostructures, a mole ratio of sulfur to selenium may be greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, or greater than or equal to about 0.83:1. In the plurality of the luminescent nanostructures, a mole ratio of sulfur to selenium may be less than or equal to about 1.1:1, less than or equal to about 1.05:1, less than or equal to about 1:1, less than or equal to about 0.9:1, less than or equal to about 0.89:1, less than or equal to about 0.87:1, or less than or equal to about 0.8:1.

In the plurality of the luminescent nanostructures, a mole ratio of sulfur to indium may be greater than or equal to about 3:1, greater than or equal to about 3.1:1, greater than or equal to about 3.2:1, or greater than or equal to about 4.1:1.

In the plurality of the luminescent nanostructures, a mole ratio of sulfur to indium may be less than or equal to about 5:1, less than or equal to about 4.8:1, or less than or equal to about 4.7:1.

In the plurality of the luminescent nanostructures, a mole ratio of zinc to indium may be less than or equal to about 13.5:1, less than or equal to about 13:1, less than or equal to about 12.5:1, less than or equal to about 12:1, or less than or equal to about 11.8:1. In the plurality of the luminescent nanostructures, a mole ratio of zinc to indium may be greater than or equal to about 7:1, greater than or equal to about 7.5:1, greater than or equal to about 7.8:1, greater than or equal to about 8:1, greater than or equal to about 9:1, greater than or equal to about 10.6:1, or greater than or equal to about 10.7:1.

In the plurality of the luminescent nanostructures, a mole ratio of a sum of sulfur and selenium to indium may be greater than or equal to about 4:1, greater than or equal to about 4.3:1, greater than or equal to about 4.4:1, greater than or equal to about 5:1, greater than or equal to about 6:1, greater than or equal to about 7:1, greater than or equal to about 8:1, greater than or equal to about 8.96:1, greater than or equal to about 9.1:1, or greater than or equal to about 9.6:1.

In the plurality of the luminescent nanostructures, a mole ratio of a sum of sulfur and selenium to indium may be less than or equal to about 11:1, less than or equal to about 10.9:1, less than or equal to about 10.5:1, less than or equal to about 10.3:1, or less than or equal to about 10.25:1.

The plurality of the luminescent nanostructures may have a size or an average size of greater than or equal to about 6 nanometers and less than or equal to about 8.5 nanometers.

The plurality of the luminescent nanostructures may have a core shell structure including a core and a shell disposed on the core. The core may include the first semiconductor nanocrystal and the shell may include the second semiconductor nanocrystal.

In an embodiment, the shell may be a multi-layered shell including at least two shell layers wherein adjacent shell layers may have different composition from one another. The multi-layered shell may include a first shell layer including zinc, selenium, and optionally sulfur; and a second shell layer being disposed on the first layer, the second layer including zinc, sulfur, and optionally selenium, wherein a composition of the first semiconductor nanocrystal may be different from a composition of the second semiconductor nanocrystal.

The second shell layer may include sulfur in a greater amount (e.g., mole) than the first shell layer. The first shell layer may include ZnSe, ZnS, ZnSeS, or a combination thereof. The second shell layer may include ZnSe, ZnS, ZnSeS, or a combination thereof. The first shell layer may be disposed on (e.g., directly on) the semiconductor nanocrystal core. The second shell layer may be disposed (e.g., directly on) the first shell layer. The second shell layer may be an outermost layer of the luminescent nanostructure.

The first shell layer may include ZnSe, ZnSeS, or a combination thereof. The first shell layer may not include sulfur. The second shell layer may include ZnS, ZnSeS, or a combination thereof. The second shell layer may not include selenium.

The first shell layer may be adjacent to the semiconductor nanocrystal core. The first layer may have a thickness of less than or equal to about 1.8 nm. The first layer may have a thickness of greater than or equal to about 1 nm.

The second shell layer may be an outermost layer of the semiconductor nanocrystal shell (or the luminescent nanostructure). The second shell layer may have a thickness of greater than or equal to about 0.4 nm. The second shell layer may have a thickness of less than or equal to about 0.65 nm.

The first composite may be prepared by a thermal treatment at a temperature of about 180° C. for about 30 minutes to be in a form of a film having a thickness of greater than or equal to about 6 micrometers (µm) (e.g., 10 µm or greater). In the first composite, an amount of the luminescent nanostructures may be less than or equal to about 45 weight percent (wt %) (e.g., about 43 wt % based on a total weight of the first composite.

A size (or an average size, hereinafter, size) of the first semiconductor nanocrystal(s) may be greater than or equal to about 1.5 nm, greater than or equal to about 2 nm, greater than or equal to about 2.5 nm, greater than or equal to about 3 nm, or greater than or equal to about 3.5 nm. The size of the first semiconductor nanocrystal(s) may be less than or equal to about 5 nm, less than or equal to about 4.5 nm, or less than or equal to about 4 nm.

A quantum efficiency (e.g., an absolute quantum efficiency, hereinafter, "quantum efficiency") of the luminescent nanostructures may be greater than or equal to about 80%, greater than or equal to about 81%, greater than or equal to about 82%, greater than or equal to about 83%, greater than or equal to about 84%, greater than or equal to about 85%, or greater than or equal to about 90%. The quantum efficiency may be less than or equal to about 100%, less than or equal to about 99.5%, or less than or equal to about 99%.

The first composite may have a light absorption for the incident light, as determined by the following equation, of greater than or equal to about 82%:

a light absorption (%)=[($BG-BG'$)/$BG$]×100(%)

BG: light dose of incident light
BG': light dose of incident light having passed through the first composite.

The first composite may have a light absorption for the second light, as determined by the following equation, of greater than or equal to about 74%:

a light absorption (%)=[($G-G'$)/$G$]×100(%)

G: light dose of second light (e.g., a portion of the incident light having wavelength of greater than about 500 nm)
G': light dose of second light having passed through the first composite.

The first composite may have a light absorption for the first light, as determined by the following equation, of greater than or equal to about 88%:

a light absorption (%)=[($B-B'$)/$B$]×100(%)

B: light dose of first light (e.g., a portion of the incident light having wavelength of less than about 500 nm)
B': light dose of first light having passed through the first composite.

The first composite may be in a form of a patterned film.

In an embodiment, an electronic apparatus (or a display device) may include the color conversion panel or the display panel.

In an embodiment, the display panel may exhibit an increased absorption of the incident light, displaying a desired image of an improved quality. The display panel may be applied to, e.g., used in, various display devices, such as a television set, a monitor, a mobile equipment, a virtual reality or augmented reality device, an automotive application display, or the like.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
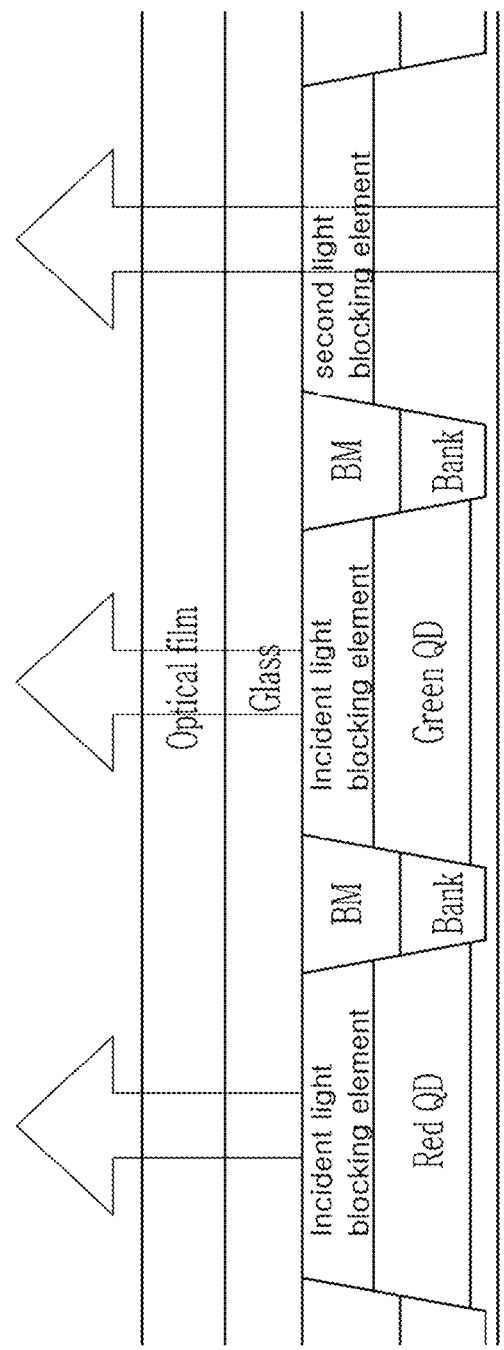
FIG. 1 is a schematic cross-sectional view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first "element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, unless a definition is otherwise provided, the term "substituted" refers to a compound or a group or a moiety wherein a, e.g., at least one, hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" refers to an inclusion of at least one (e.g., one to three) heteroatom(s), wherein the heteroatom(s) is each independently N, O, S, Si, P, or a combination thereof.

As used herein, unless a definition is otherwise provided, the term "aliphatic hydrocarbon group" refers to a C1 to C30 linear or branched alkyl group, a C2 to C30 linear or branched alkenyl group, or a C2 to C30 linear or branched alkynyl group.

As used herein, unless a definition is otherwise provided, the term "aromatic" or "aromatic hydrocarbon group" refers to a moiety having at least one aromatic ring, optionally together with one or more nonaromatic rings, formed by the removal of one or more hydrogen atoms from one or more rings of an aromatic hydrocarbon, wherein the hydrogen atom(s) may be removed from the aromatic or, if present, nonaromatic ring. One or more heteroatoms, e.g., N, P, S, O, Si, or a combination thereof may be present in one or more rings. The aromatic hydrocarbon group may be optionally substituted with one or more substituents.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having a carbon-carbon double bond.

As used herein, when a definition is not otherwise provided, "alkynyl" refers to a linear or branched monovalent hydrocarbon group having a carbon-carbon triple bond.

As used herein, unless a definition is otherwise provided, the term "aryl group" refers to a group containing one to five aromatic rings, having a valence of one and formed by the removal of a hydrogen atom from one ring. A "heteroaryl group" refers to an aryl group wherein at least one aromatic ring carbon atom, is replaced by a heteroatom, e.g., N, P, S, O, Si, or a combination thereof. The aryl and heteroaryl groups may be optionally substituted with one or more substituents. The aryl group can be a C6 to C30 aryl group and the heteroaryl group can be a C2 to C30 heteroaryl group.

As used herein, unless a definition is otherwise provided, the term "(meth)acrylate" refers to acrylate, methacrylate, or a combination thereof. The (meth)acrylate may include a (C1 to C10 alkyl) acrylate, a (C1 to C10 alkyl) methacrylate, or a combination thereof.

As used herein, the term "Group" may refer to a group of Periodic Table.

As used herein, "Group I" refers to Group IA and Group IB, and includes Li, Na, K, Rb, or Cs, but is not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" includes a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, a nanostructure is a structure having at least one region or characteristic dimension with a dimension of less than or equal to about 500 nm. In an embodiment, a dimension (or an average) of the nanostructure(s) is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any shape.

The nanostructure may include a nanowire, a nanorod, a nanotube, a branched nanostructure, a nanotetrapod, a nanotripod, a nanobipod, a nanocrystal, a nanodot, a multi-pod-type shape such as a shaping having at least two pods (e.g., of different sizes), or the like, and is not limited thereto. The nanostructure can be, e.g., substantially crystalline, substantially monocrystalline, polycrystalline, fully or partially amorphous, or a combination thereof.

As used herein, the term "quantum dot" refers to a nanostructure (for example, a semiconductor based nanocrystal particle that exhibits quantum confinement or exciton confinement). The quantum dot is a type of light emitting nanostructure (for example capable of emitting light by an energy excitation). As used herein, unless defined otherwise, a shape of the "quantum dot" may not particularly limited.

In an embodiment, "dispersion" may refer to a system wherein a dispersed phase is a solid and a continuous phase includes a liquid or a solid different from the dispersed phase. In an embodiment, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, the term "average" (e.g., an average size of the quantum dot) may be mean or median. In an embodiment, the average may be "mean" average.

In an embodiment, the quantum efficiency (which can be interchangeably used with the term "quantum yield") may be measured in a solution state or a solid state (in a composite). In an embodiment, the quantum efficiency may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The full width at half maximum (FWHM) and the maximum PL peak wavelength may be determined by a photoluminescent spectrum obtained by a spectrophotometer (or Fluorescence Spectrophotometer).

As used herein, "first absorption peak wavelength" refers to a wavelength of the first main peak appearing in the lowest energy region in an ultraviolet-visible absorption spectrum.

As used herein, a dimension such as a size, a diameter, or a thickness may refer to an average dimension. The average may be a mean average or a median average value. In an embodiment, the dimension may be determined by using an electron microscopy analysis. In an embodiment, the dimension may be determined from a calculation taking into consideration the composition and optical properties (e.g., an ultraviolet (UV) absorption wavelength) of the nanostructure (quantum dots).

A nanostructure may be included in a variety of electronic devices. An electronic and/or an optical property of the nanostructure may be controlled for example, by its compositional or dimensional features such as elemental composition, size and/or a shape of the nanostructure. In an embodiment, the luminescent nanostructure may include a semiconductor nanocrystal particle. The luminescent nanostructure (e.g., a quantum dot) may have a relatively large surface area per a unit volume and may show a quantum confinement effect, and thereby, exhibit properties different from a bulk material of the same composition. Therefore, a luminescent nanostructure such as a quantum dot may absorb energy provided from an excitation source (e.g., incident light or applied voltage), to place the nanostructure in an excited state, and upon relaxation, the nanostructure is capable of emitting light corresponding to its bandgap energy.

The luminescent nanostructure may be processed into a patterned composite (e.g., a patterned polymer composite) for its application in a color conversion panel (e.g., a luminescent-type color filter) or a display panel including the same. In an embodiment, unlike a liquid crystal display device having a white light backlight unit, a display panel may include a quantum dot-based color conversion panel or a luminescent-type color filter, for example, in a front face of the display panel. The color conversion panel or the color filter converts a spectrum of incident light supplied from a light emitting panel to a desired and/or more refined light spectrum (e.g., a red light or a green light). Moreover, as a result of light scattering of the converted light such a type of display panel may provide a relatively wide viewing angle and may address a light loss problem for example, caused by using an absorption-type color filter.

The color filter or the color conversion panel including the luminescent nanostructures may be used with a variety of light sources, and thus, luminous efficiency and/or color conversion efficiency of the incident light provided by a given light source may become an area of great interest in the continuing development of the color conversion panel industry. In an embodiment, an organic electroluminescent device may be used as an incident light source and a luminous efficiency and a photoconversion efficiency of the incident light may have an effect on a display quality of a display panel. There have been vigorous and ongoing research efforts to achieve efficient absorption of incident light emitted from a given light source (e.g., a micro-LED or an electroluminescent device) by a luminescent nanostructure (quantum dot) or a composite including the nanostructure, which is disposed in a color conversion region of a color conversion panel. In an embodiment, the composite may further include a light scatterer and/or may have an increased thickness for improving light absorption. In addition, light absorption of incident light by the luminescent nanostructures present in the composite can raise a main technological issue or concern.

Luminescent nanostructures may include a toxic heavy metal such as cadmium, lead, mercury, or a combination thereof to order to exhibit a desired level of light absorption and luminous properties. However, such nanostructures that include cadmium or the other toxic heavy metals may cause environment/health problems and is or are restricted elements, particularly in consumer devices. Accordingly, development of a cadmium-free luminescent nanostructure is desired in the light emitting or display art. To this end, a semiconductor nanocrystal including a Group III-V compound is one of the most researched materials. However, the present inventors have found that a cadmium free, luminescent nanostructure including a group III-V compound such as an indium phosphide tends to exhibit relatively poor optical properties (e.g., the nanostructure may exhibit relatively insufficient luminous efficiency, and/or incident light absorption) in comparison with a nanostructure that would include one or more of these toxic heavy metals. Therefore, there is a great interest and need to develop a display panel that does not include nanostructures with such toxic heavy metals, but yet, exhibits improved or more desirable optical properties.

In an embodiment, a display panel may include a light emitting panel that emits a color mix of incident light, (e.g., incident light including wavelengths of blue and green light) and thereby, exhibit overall improved optical properties in a display device. The light emitting panel may contribute to increasing a luminous efficiency of a device and/or improving a lifetime property. In an embodiment, the light emitting panel may have a tandem (or stacked) structure wherein a plurality of light emissive layers are laminated. Without wishing to be bound by any theory, the incident light may have a relatively direct effect on an efficiency of a given display panel. For example, a blue light emitted from an organic electroluminescent device may be a fluorescent-type light with relatively low intrinsic efficiency. In a display panel of an embodiment, a light emitting panel that is configured to emit blue light, e.g., from a blue fluorescent dopant, may include a tandem structure with a green phosphorescence layer to emit a mixed light including a green light and a blue light, to enhance the efficiency of the display panel. Together with the light emitting panel capable of emitting the mixed incident light, a display panel of an embodiment may further include a color conversion panel including luminescent nanostructures that may exhibit a controlled optical property (such as a UV-Vis absorption curve or an absorbance ratio at predetermined wavelengths). Collectively, with the light emitting panel emitting the mixed incident light, the color conversion panel of the embodiment may provide improved optical properties (e.g., an absorbance for the incident light and a light conversion efficiency) to the overall display device.

Figure 2:
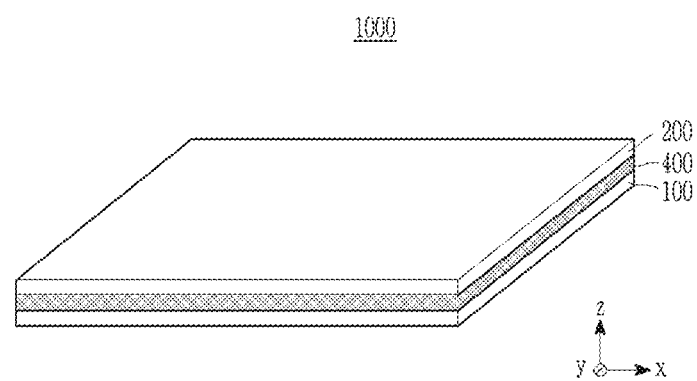
FIG. 2 is a perspective view showing an example of a display panel of an embodiment.

Hereinafter, a display panel according to one or more embodiments will be described. FIG. 2 is a perspective view illustrating an example of a display panel according to one or more embodiments, FIG. 3 is a cross-sectional view of the display panel of FIG. 2, FIG. 4 is a plan view illustrating an example of an arrangement of pixels of the display panel of FIG. 2, and FIG. 5A is a cross-sectional view of the display panel of FIG. 4 taken along line IV-IV.

Figure 3:
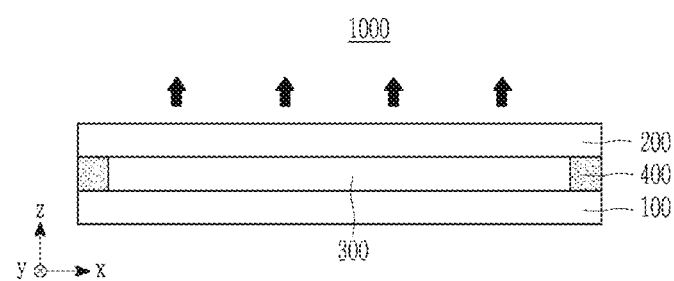
FIG. 3 is a cross-sectional view of the display panel of FIG. 1.

Referring to FIGS. 2 and 3, the display panel 1000 according to an embodiment may include a light emitting panel 100 and a color conversion panel 200 that includes a surface that is opposite a surface of the light emitting panel 100. In other words, the light emitting panel 100 and the color conversion panel 200 face each other. The display panel 1000 may further include a light transmitting layer 300 disposed between the light emitting panel 100 and the color conversion panel 200, a binding element 400 for combining (e.g., adhering) the light emitting panel 100 with (e.g., to) the color conversion panel 200, or a combination thereof.

The light emitting panel 100 and the color conversion panel 200 may face each other with the light transmitting layer 300 therebetween, and the color conversion panel 200 may be positioned such that light emitted from the light emitting panel 100 is directed toward the color conversion panel 200. The binding element 400 may be along the edges of the light emitting panel 100 and the color conversion panel 200, and may be, for example, a sealant.

Figure 4:
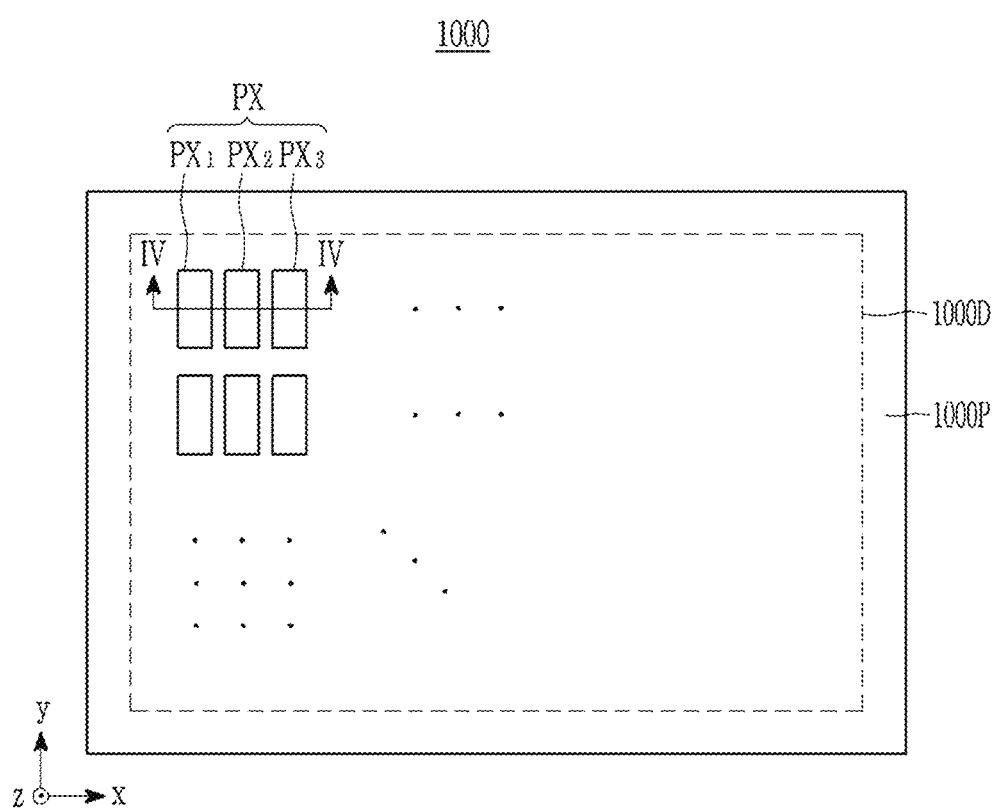
FIG. 4 is a plan view illustrating an example of a pixel arrangement of the display panel of FIG. 3.
Figure 5A:
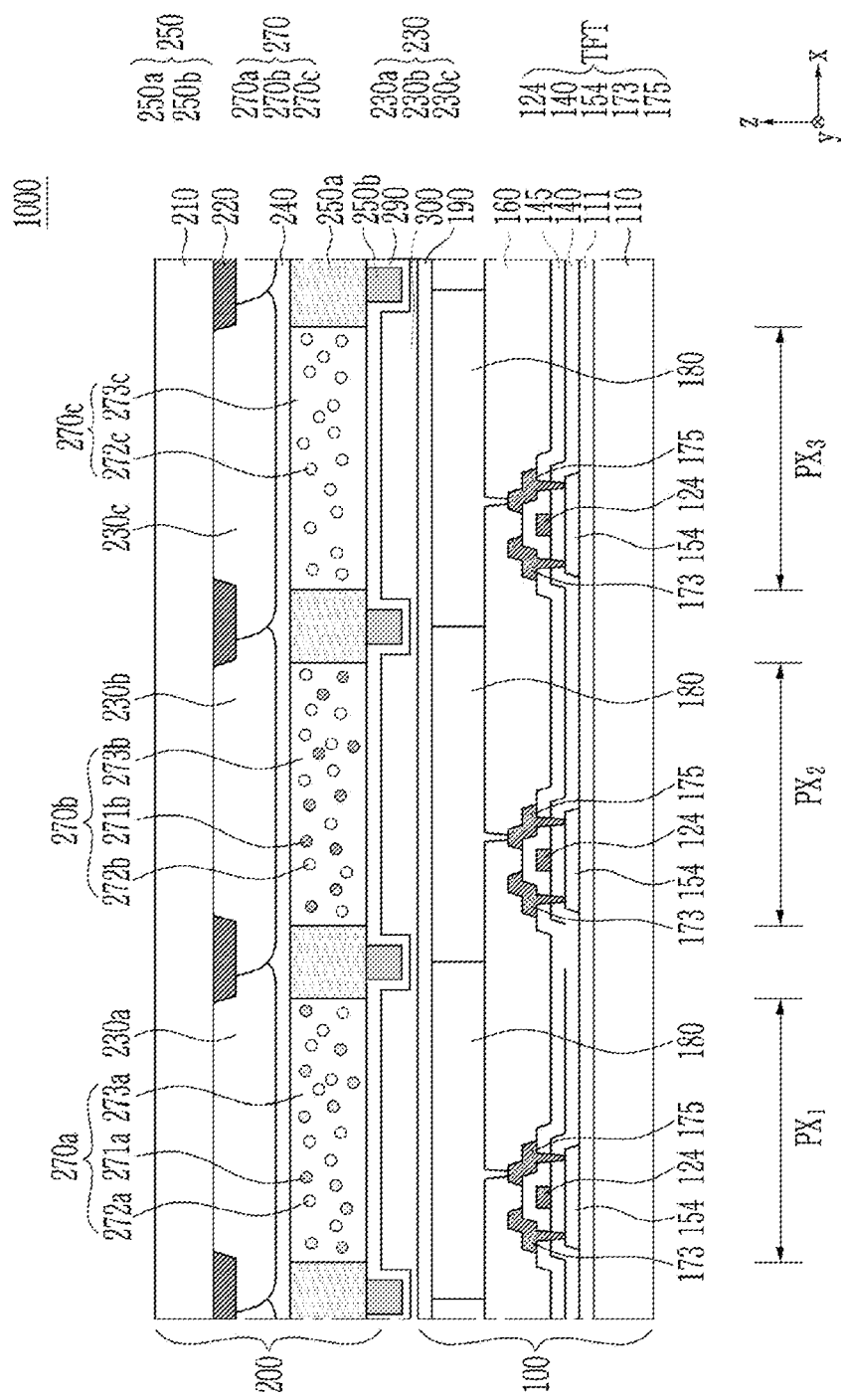
FIG. 5A is a cross-sectional view taken along line IV-IV (as shown in FIG. 4)

Referring to FIG. 4, a display panel 1000 according to an embodiment may include a display area 1000D for displaying an image and a non-display area 1000P around the display area 1000D where the binding element 400 may be located.

The display area 1000D may include a plurality of pixels PXs arranged along a row (e.g., x direction) and/or a column (e.g., y direction), and each pixel PX may include a plurality of sub-pixels $PX_1$, $PX_2$, and $PX_3$ to display different colors. Herein, as an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PENTILE® matrix or arrangement structure (e.g., an RGBG matrix, RGBG structure, or RGBG matrix structure), and/or a diamond matrix, but embodiments of the present disclosure are not limited thereto.

Each of the sub-pixels $PX_1$, $PX_2$, and $PX_3$ may display a color of three primary colors or a combination of three primary colors, for example, red, green, blue, or a combination thereof (e.g., white light). For example, the first sub-pixel $PX_1$ may display red, the second sub-pixel $PX_2$ may display green, and the third sub-pixel $PX_3$ may display blue.

In the drawings, an example in which all sub-pixels have the same size is illustrated, but the present disclosure is not limited thereto. At least one of the sub-pixels may be larger or smaller than the other sub-pixels. In the drawings, an example in which all sub-pixels have the same shape may be illustrated, but the present disclosure is not limited thereto. At least one of the sub-pixels may have a different shape from other sub-pixels.

In an embodiment, a light emitting panel 100 of the display panel may emit a light of mixed color including a first light (e.g., a blue light) and a second light (e.g., a green light) for example without emitting red light having a wavelength of greater than or equal to about 600 nm and less than or equal to about 680 nm to provide a light emitting panel with an improved luminous efficiency.

A (maximum) luminescent peak wavelength of the first light may be in a range of greater than or equal to about 450 nm, greater than or equal to about 455 nm, or greater than or equal to about 460 nm. A (maximum) luminescent peak wavelength of the first light may be in a range of less than or equal to about 480 nm, less than or equal to about 475 nm, less than or equal to about 470 nm, or less than or equal to about 465 nm. A (maximum) luminescent peak wavelength of the second light may be in a range of greater than or equal to about 500 nm, greater than or equal to about 505 nm, greater than or equal to about 510 nm, or greater than or equal to about 515 nm. A (maximum) luminescent peak wavelength of the second light may be in a range of less than or equal to about 580 nm, less than or equal to about 575 nm, less than or equal to about 570 nm, less than or equal to about 565 nm, less than or equal to about 560 nm, less than or equal to about 550 nm, less than or equal to about 540 nm, less than or equal to about 535 nm, or less than or equal to about 530 nm.

Figure 5B:
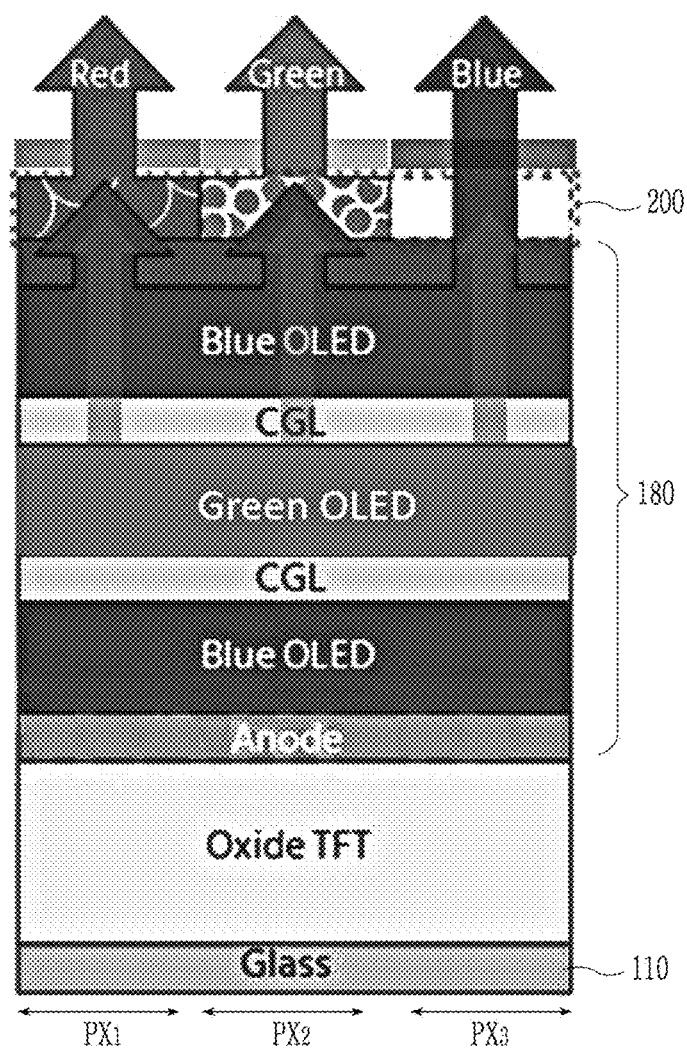
FIG. 5B is a cross-sectional view of a display panel according to an embodiment.

Referring to FIG. 1, FIG. 5A, and FIG. 5B, a display panel including a light emitting panel 100 and a color conversion panel 200 will be explained in further detail.

Referring to FIG. 5A, the light emitting panel 100 may include a light emitting element to emit light of predetermined wavelength region (spectrum), and a circuit element for switching and/or driving the light emitting element. For example, the light emitting panel 100 may include a lower substrate 110, a buffer layer 111, a thin film transistor TFT, a light emitting element 180, and an encapsulation layer 190.

The lower substrate 110 may include a glass substrate and/or a polymer substrate. The polymer substrate may include, for example, polyimide, polyamide, poly(amide-imide), polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, an organic-inorganic material, or a combination thereof. The buffer layer 111 may include, for example, an oxide, a nitride, and/or an oxynitride, and may include, for example, silicon oxide, silicon nitride, silicon oxynitride, or a combination thereof, but is not limited thereto. The buffer layer 111 may be one layer or two or more layers, and may cover a portion of or the entire surface of the lower substrate 110. In some embodiments, the buffer layer 111 may be omitted.

The thin film transistor TFT may be a three-terminal element for switching and/or driving the light emitting element 180, which will be further described below, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically coupled to the semiconductor layer 154. In the drawings, a coplanar top gate structure may be shown as an example, but the structure is not limited thereto and may have various structures.

The gate electrode 124 may be electrically coupled to a gate line, and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, and/or oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions on both sides of the channel region and may be electrically coupled to the source electrode 173 and the drain electrode 175, respectively.

The gate insulating layer 140 may include an organic material, an inorganic material, or an organic-inorganic material, and may include, for example, an oxide, a nitride, and/or an oxynitride, and may include, for example, silicon oxide, silicon nitride, silicon oxynitride, or a combination thereof, but is not limited thereto. In the drawings, an example in which the gate insulating layer 140 may be formed on the entire surface of the lower substrate 110 may be illustrated, but the present disclosure is not limited thereto and may be selectively formed between the gate electrode 124 and the semiconductor layer 154. The gate insulating layer 140 may be formed of one, two, or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically coupled to the doped regions of the semiconductor layer 154, respectively. The source electrode 173 may be electrically coupled to a data line, and the drain electrode 175 may be electrically coupled to a light emitting element 180 to be further described below.

An interlayer insulating layer 145 may be additionally formed between the gate electrode 124 and the source/drain electrodes 173/175. The interlayer insulating layer 145 may include an organic material, an inorganic material, an organic-inorganic material, or a combination thereof, for example, oxide, nitride, and/or oxynitride, for example, silicon oxide, silicon nitride, silicon oxynitride, or a combination thereof, but is not limited thereto. The interlayer insulating layer 145 may be formed of one, two, or more layers.

A protective layer 160 may be formed on the thin film transistor TFT. The protective layer 160 may be, for example, a passivation layer. The protective layer 160 may include an organic material, an inorganic material, an organic-inorganic material, or a combination thereof, for example, polyacrylic, polyimide, polyamide, poly(amide-imide), or a combination thereof, but is not limited thereto. The protective layer 160 may be formed of one, two, or three or more layers.

The light emitting element 180 may be in each sub-pixel $PX_1$, $PX_2$, and $PX_3$, and the light emitting element 180 in each sub-pixel $PX_1$, $PX_2$, and $PX_3$ may be independently driven. The light emitting element 180 may be, for example, a light emitting diode, and may include a pair of electrodes and a light emitting layer between the pair of electrodes. The light emitting layer may include a light emitter to emit light in a set or predetermined wavelength spectrum, and, for example, may include a light emitter to emit light of a first emission spectrum belonging to a visible wavelength spectrum. The light emitter may include an organic light emitter, an inorganic light emitter, an organic-inorganic light emitter, or a combination thereof, and may be one type or two or more types.

The light emitting element 180 may be, for example, an organic light emitting diode (OLED), an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

In an embodiment, referring to FIG. 5B schematically showing a display panel, a light emitting panel may include an oxide-based TFT on a substrate and on the TFT, a light emitting element having a tandem structure is disposed. The light emitting element may include a blue light emitting layer, a green light emitting layer, and another blue light emitting layer disposed between the first electrode and the second electrode, and a charge generation layer CGL may be disposed between two stacked light emitting layers. Referring to FIG. 5B, the first electrode and the second electrode may not be patterned, but these electrodes may be patterned to correspond to each pixel unit. The first electrode may be an anode or a cathode. The second electrode may be an anode or a cathode.

Figure 6A:
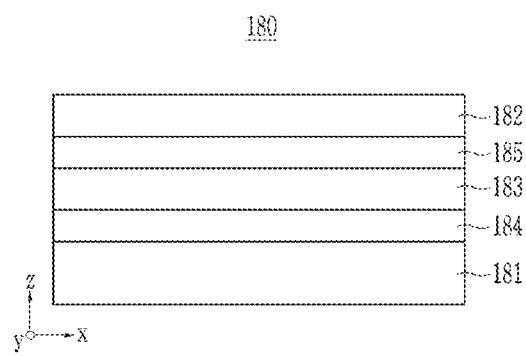
FIGS. 6A, 6B, 6C, and 6D are cross-sectional views showing examples of light emitting elements.
Figure 6B:
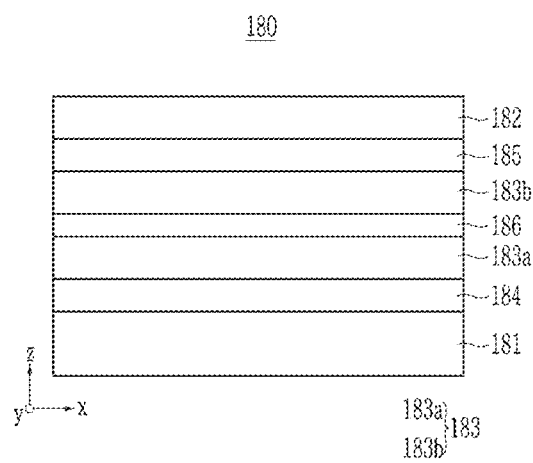
Figure 6C:
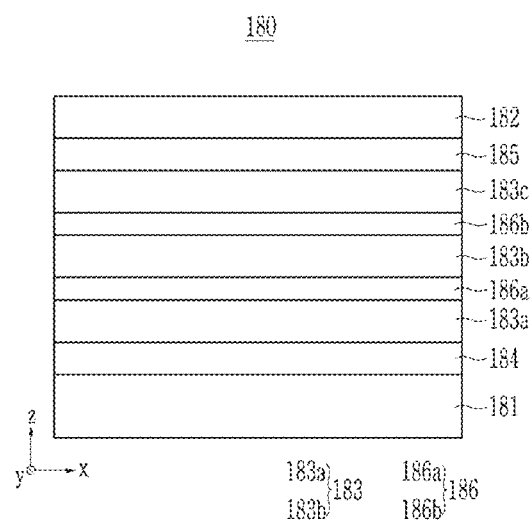

FIGS. 6A to 6C are cross-sectional views showing examples of light emitting elements. Referring to FIG. 6A, the light emitting element 180 may include a first electrode 181 and a second electrode 182 facing each other; a light emitting layer 183 disposed between the first electrode 181 and the second electrode 182; and optionally, auxiliary layers 184 and 185 between the first electrode 181 and the light emitting layer 183 and between the second electrode 182 and the light emitting layer 183, respectively.

The first electrode 181 and the second electrode 182 each with a surface opposite the other (i.e., face each other along a thickness direction, (for example, the z direction), and any one of the first electrode 181 and the second electrode 182 may be an anode and the other may be a cathode. The first electrode 181 may be a light transmitting electrode, a translucent electrode, or a reflective electrode, and the second electrode 182 may be a light transmitting electrode, a translucent electrode, or a reflective electrode. The light transmitting electrode or (trans)reflective electrode may be, for example, made of a single layer or multiple layers of metal thin film including conductive oxides such as indium tin oxide ITO, indium zinc oxide IZO, zinc oxide ZnO, tin oxide SnO, aluminum tin oxide AITO, and/or fluorine-doped tin oxide FTO and/or silver Ag, copper Cu, aluminum Al, magnesium Mg, magnesium-silver Mg—Ag, magnesium-aluminum Mg—Al, or a combination thereof. The reflective electrode may include a metal, a metal nitride, or a combination thereof, for example, silver Ag, copper Cu, aluminum Al, gold Au, titanium Ti, chromium Cr, nickel Ni, an alloy thereof, a nitride thereof (e.g., TiN), or a combination thereof, but is not limited thereto.

The light emitting layer 183 may include a first light emitter to emit a first light of a first emission spectrum, and a second light emitter to emit a second light of a second emission spectrum. The first emission spectrum may be a blue emission spectrum and the second emission spectrum may be a green emission spectrum.

A maximum luminescent wavelength of the first light emitting spectrum (e.g., the blue light) may be greater than or equal to about 400 nm and less than or equal to about 500 nm, or from about 410 nm to about 490 nm, from about 420 nm to about 480 nm, from about 430 nm to about 470 nm, from about 440 nm to about 465 nm, from about 445 nm to about 460 nm, from about 450 nm to about 458 nm, or any one range derived from the stated wavelengths. The blue light may have a maximum luminescent wavelength within the aforementioned range. In an embodiment, the blue light may have a luminescent peak wavelength in a range of greater than or equal to about 400 nm and less than or equal to about 500 nm, from about 410 nm to about 490 nm, from about 420 nm to about 480 nm, from about 430 nm to about 475 nm, from about 440 nm to about 460 nm, from about 445 nm to about 458 nm, from about 450 nm to about 455 nm, or any one range derived from the stated wavelengths.

A maximum luminescent wavelength of the second light emitting spectrum (e.g., the green light) may be in a range of greater than or equal to about 500 nm and less than or equal to about 590 nm, from about 510 nm to about 580 nm, from about 515 nm to about 570 nm, from about 520 nm to about 560 nm, from about 525 nm to about 555 nm, from about 530 nm to about 550 nm, from about 535 nm to about 545 nm, or any one range derived from the stated wavelengths.

The green light may have a luminescent peak wavelength within the aforementioned range. In an embodiment, the green light may have a luminescent peak wavelength in a range of greater than or equal to about 500 nm and less than or equal to about 580 nm, from about 510 nm to about 570 nm, from about 515 nm to about 565 nm, from about 520 nm to about 560 nm, from about 525 nm to about 550 nm, from about 530 nm to about 545 nm, from about 535 nm to about 540 nm, or any one range derived from the stated wavelengths.

The first light emitter (e.g., a blue light emitting material) may be a single material or compound or a mixture of at least two materials or compounds. The second light emitter (e.g., a green light emitting material) may be a single material or compound or a mixture of at least two materials or compounds.

In an embodiment, the light emitting layer 183, a first light emitter, or a second light emitter, may include a host compound(s) and a dopant compound(s).

In an embodiment, the light emitting layer 183 may include a phosphorescent compound, a fluorescent compound, or a combination thereof. In an embodiment, the first light emitter, the second light emitter, or a combination thereof (hereinafter, may be simply referred to as "light emitter") may include a phosphorescent compound, a fluorescent compound, or a combination thereof. In an embodiment, the light emitter may include an organic light emitter, and the organic light emitter may be a low molecular weight compound, a polymer, or a combination thereof. In an embodiment, the light emitter may include an organic light emitter, and the light emitting element 180 may be an organic light emitting diode.

The phosphorescent compound and the fluorescent compound may be selected appropriately and are not particularly limited. In an embodiment, the light emitter may include a dopant such as a phosphorescent dopant. The dopant may be an organic metal compound including a metal (M). The metal M may include iridium (Ir), platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), gold (Au), or a combination thereof.

In an embodiment, the phosphorescent dopant may include an organic metal compound including iridium (Ir), an organic metal compound including platinum (Pt), or an organic metal compound including osmium (Os). In an embodiment, the dopant may include an organic metal compound having a square-planar coordination structure including a metal M, for example, as set forth herein. The dopant may include a substituted or unsubstituted $C_5$-$C_{30}$ carbocyclic group, a substituted or unsubstituted $C_1$-$C_{30}$ heterocyclic group, a substituted or unsubstituted non-cyclic group, or a combination thereof. The substituted or unsubstituted $C_5$-$C_{30}$ carbocyclic group and the substituted or unsubstituted $C_1$-$C_{30}$ heterocyclic group may be a 6-membered ring, a condensed ring in which two or more 6-membered rings are condensed each other, a condensed ring in which at least one 6-membered ring and one 5-membered ring are condensed each other, or a combination thereof. In an embodiment, the 6-membered ring may include a cyclohexane group, a cyclohexene group, an adamantane group, a norbornane group, a norbornene group, a benzene group, a pyridine group, a pyrimidine group, a pyrazine group, a pyridazine group, and a triazine group; and the 5-membered ring may be a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, a thiadiazole group, or a combination thereof.

The dopant may include a metal M (e.g., as described herein) and an organic ligand, and the metal M and the organic ligand may form one, two, or three cyclometallated ring(s). The dopant may include a metal M and a four-coordinate organic ligand that forms three or four cyclometallated ring(s). The four-coordinate organic ligand may include a benzimidazole group, a benzene group, a pyridine group, an imidazole group, or a combination thereof, but is not limited thereto. The organic ligand may include selective substitution of hydrogen with one or more sites of deuteration.

In an embodiment, the light emitter may include an inorganic light emitter, and the inorganic light emitter may include an inorganic semiconductor, a quantum dot, a perovskite material, or a combination thereof. The inorganic semiconductor may include a metal nitride, a metal oxide, or a combination thereof, which may include a Group III metal such as aluminum, gallium, indium, or thallium; a Group IV metal such as silicon, germanium, tin, or the like; or a combination thereof. In an embodiment, the light emitter may include an inorganic light emitter, and the light emitting element 180 may be a quantum dot light emitting diode, a perovskite light emitting diode, and/or a micro light emitting diode.

In an embodiment, a light emitting element 180 may further include an auxiliary layer. The auxiliary layers 184 and 185 may be disposed between the first electrode 181 and the light emitting layer 183 or disposed between the second electrode 182 and the light emitting layer 183, respectively, and may be a charge auxiliary layer to control injection and/or mobility of charge carriers (electrons or holes), respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. In some embodiments, one or both of the auxiliary layers 184 and 185 may be omitted. A material for the auxiliary layer may be selected appropriately in accordance with the general knowledge in the art.

The light emitting elements 180 in each of the sub-pixels $PX_1$, $PX_2$, and $PX_3$ may be the same or different from each other. The light emitting elements 180 in each of the sub-pixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm. The light emitting elements 180 in each of the sub-pixels $PX_1$, $PX_2$, and $PX_3$ may be separated by a pixel defining layer.

In an embodiment, a light emitting element 180 may have a tandem (or stacked) structured light emitting device. In an embodiment, the light emitting element or a light emitting layer may include a first light emitting layer and a second light emitting layer disposed on the first light emitting layer. The first light emitting layer may emit the first light and the second light emitting layer may emit the second light. A first charge generation layer may be disposed between the first light emitting layer and the second light emitting layer. In an embodiment, a charge auxiliary layer may be disposed between the first electrode and the first light emitting layer, a charge auxiliary layer may be disposed between the second electrode and the second emitting layer, or the same or different charge auxiliary layers may be disposed between the first electrode and the first light emitting layer and between the second electrode and the second emitting layer.

In an embodiment, the light emitting layer may include a second light emitting layer disposed (inserted) between two (adjacent) first light emitting layers, a first light emitting layer disposed (inserted) between two (adjacent) second light emitting layers, or a combination thereof. The first light emitting layer may be configured to emit the first light. The second light emitting layer may be configured to emit the second light.

Referring to FIG. 6B, the light emitting element 180 may have a tandem structure, and may include a first electrode 181 and a second electrode 182 facing each other; a first light emitting layer 183a and a second light emitting layer 183b disposed between the first electrode 181 and the second electrode 182; a charge generation layer 186 disposed between the first light emitting layer 183a and the second light emitting layer 183b, and optionally, auxiliary layers 184 and 185 disposed between the first electrode 181 and the first light emitting layer 183a and/or disposed between the second electrode 182 and the second light emitting layer 183b.

The first electrode 181, the second electrode 182, and the auxiliary layers 184 and 185 may be similar to those described above.

The first light emitting layer 183a and the second light emitting layer 183b may emit light having the same or different emission spectrums or a different maximum emission wavelength. In an embodiment, the first light emitting layer 183a may emit light of a blue light spectrum and the second light emitting layer 183b may emit light of a green light spectrum. Detailed descriptions may be similar to the light emitting layer 183 described above.

The charge generation layer 186 may inject electric charges into the first light emitting layer 183a and/or the second light emitting layer 183b, and may control a charge balance between the first light emitting layer 183a and the second light emitting layer 183b. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Referring to FIG. 6C, the light emitting element 180 may have a tandem structure, and may include a first electrode 181 and a second electrode 182 facing each other; a first light emitting layer 183a, a second light emitting layer 183b, and a third light emitting layer 183c disposed between the first electrode 181 and the second electrode 182; a first charge generation layer 186a disposed between the first light emitting layer 183a and the second light emitting layer 183b; a second charge generation layer 186b disposed between the second light emitting layer 183b and the third light emitting layer 183c; and optionally, auxiliary layers 184 and 185 disposed between the first electrode 181 and the first light emitting layer 183a and/or disposed between the second electrode 182 and the third light emitting layer 183c.

The first electrode 181, the second electrode 182, and the auxiliary layers 184 and 185 may be similar to those described above.

The first light emitting layer 183a, the second light emitting layer 183b, and the third light emitting layer 183c may emit light of the same or different emission spectrum. In an embodiment, the first light emitting layer 183a and the third light emitting layer 183c may emit light of a blue light spectrum and the second light emitting layer 183b may emit light of a green light spectrum. In an embodiment, the first light emitting layer 183a and the third light emitting layer 183c may emit light of a green light spectrum and the second light emitting layer 183b may emit light of a blue light spectrum. Detailed descriptions may be similar to the light emitting layer 183 described above.

The first charge generation layer 186a may inject electric charges into the first light emitting layer 183a and/or the second light emitting layer 183b, and may control charge balances between the first light emitting layer 183a and the second light emitting layer 183b. The second charge generation layer 186b may inject electric charges into the second light emitting layer 183b and/or the third light emitting layer 183c, and may control charge balances between the second light emitting layer 183b and the third light emitting layer 183c. Each of the first and second charge generation layers 186a and 186b may be one layer or two or more layers.

Figure 6D:
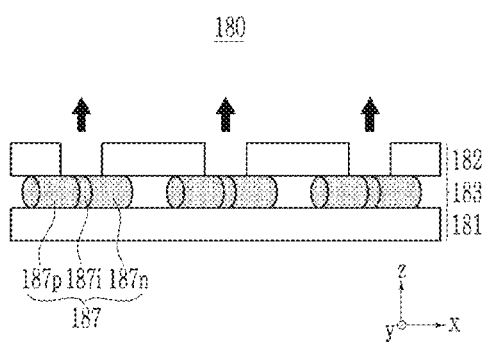

Referring to FIG. 6D, the light emitting element 180 may include a first electrode 181, a second electrode 182, and a light emitting layer 183 including a plurality of nanostructures 187. In an embodiment, one of the first electrode 181 and the second electrode 182 may be an anode and the other may be a cathode. The first electrode 181 and the second electrode 182 may be electrodes patterned according to arrangement directions of the plurality of nanostructures 187, and may include, for example, conductive oxides such as indium tin oxide ITO, indium zinc oxide IZO, zinc oxide ZnO, tin oxide SnO, aluminum tin oxide AITO, and fluorine-doped tin oxide FTO; silver Ag, copper Cu, aluminum Al, gold Au, titanium Ti, chromium Cr, nickel Ni, an alloy thereof, a nitride thereof (e.g., TiN); or a combination thereof, but are not limited thereto.

The light emitting layer 183 may include a plurality of nanostructures 187, and each of the sub-pixels $PX_1$, $PX_2$, and $PX_3$ may include a plurality of nanostructures 187. The plurality of nanostructures 187 may be arranged along one direction, but the present disclosure is not limited thereto. The nanostructures 187 may be a compound semiconductor to emit light of a set or predetermined wavelength spectrum when an electric current is applied, and may be, for example, linear nanostructures such as nanorods and/or nanoneedles. The diameter or long diameter of the nanostructures 187 may be, for example, several to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, or greater than or equal to about 5.0; from about 1 to about 20, from about 1.5 to about 20, from about 2.0 to about 20, from about 3.0 to about 20, from about 4.0 to about 20, from about 4.5 to about 20, or from about 5.0 to about 20.

The nanostructures 187 may include a p-type region 187p, an n-type region 187n, and a multiple quantum well region 187i, and may emit light from the multiple quantum well region 187i. The nanostructures 187 may include, for example, gallium nitride GaN, indium gallium nitride InGaN, aluminum gallium nitride AlGaN, or a combination thereof, and may have, for example, a core-shell structure.

The plurality of nanostructures 187 may emit light with the same or different emission spectra, and may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm.

In an embodiment, the display panel includes a color conversion panel 200. The color conversion panel 200 may be provided with incident light of mixed color from the light emitting panel 100 and convert the spectrum of incident light into to an emission spectrum different from that of the incident light. The emitted light from the color conversion panel 200 may then be directed out from the device to an observer (not shown). The color conversion panel may include a color conversion layer including a color conversion region (e.g., two or more color conversion regions), the color conversion region may include a first region corresponding to a red pixel, the first region may include a first composite including a matrix and a plurality of luminescent nanostructures dispersed in the matrix and being configured to convert the luminescent spectrum of the incident light as described.

Referring to FIG. 1, in the display panel of an embodiment, the color conversion panel 200 may further include a partition wall (e.g., a black matrix (BM), a bank, or both) to define each region (270a, 270b, 270c) of the color conversion layer 270. The color conversion layer may be a patterned film of a composite including luminescent nanostructures. The color conversion region may include a first region(s) 270a (e.g., receiving the incident light and) converting the light spectrum of the incident light into a red light spectrum. The first region(s) 270a may be arranged to correspond to a red pixel. The first region 270a may include the first (luminescent) composite. In an embodiment, the first composite may include a matrix 273a (e.g. a polymer matrix) and a plurality of luminescent nanostructures 271a (e.g., semiconductor nanoparticles or quantum dots) dispersed in the matrix 273a. The first composite (or the first region) or the luminescent nanostructures included therein may be configured to emit red light.

A maximum luminescent peak spectrum of the red light or the luminescent nanostructures may be greater than or equal to about 600 nm, greater than or equal to about 605 nm, greater than or equal to about 610 nm, greater than or equal to about 615 nm, greater than or equal to about 620 nm, or greater than or equal to about 625 nm. A maximum luminescent peak spectrum of the red light or the luminescent nanostructures may be less than or equal to about 660 nm, less than or equal to about 655 nm, less than or equal to about 650 nm, less than or equal to about 645 nm, less than or equal to about 640 nm, or less than or equal to about 635 nm.

The color conversion region may further include a second region(s) 270*b* that is configured to emit light of a different color from the red light or first region (e.g., to emit green light) as shown. The second region 270*b* may include a second (luminescent) composite. The luminescent composite disposed in the second region 270*b* may include a matrix 273*b* and luminescent nanostructures 271*b* dispersed in the matrix 273*b* and being configured to emit light of a different color (e.g., green light) from the first composite disposed in the first region. A maximum luminescent peak wavelength of the green light may be the same as set forth herein.

The color conversion panel may further include a third region(s) 270*c* (for example, including a third composite) that may emit or allow blue light of the incident light to pass through. The third region 270*c* may include a third composite, and the third composite includes a matrix (e.g., a polymer matrix) 273*c* without a luminescent nanostructure. A maximum luminescent peak wavelength of the blue light may be the same as set forth herein. In an embodiment, a maximum luminescent peak wavelength of the blue light may be greater than or equal to about 380 nm (for example, greater than or equal to about 440 nm, greater than or equal to about 445 nm, greater than or equal to about 450 nm, or greater than or equal to about 455 nm) and less than or equal to about 480 nm (less than or equal to about 475 nm, less than or equal to about 470 nm, less than or equal to about 465 nm, or less than or equal to about 460 nm).

Moreover, light scatterers 272*a*, 272*b*, and 272*c* may also be included in the respective composites in order to scatter incident light.

Referring to FIG. 5A and FIG. 5B, the color conversion panel 200 or the color conversion layer 270 includes a surface(s) opposite a surface(s) of the light emitting panel, i.e., the color conversion panel 200 may face the light emitting element 180 of the light emitting panel 100. The color conversion panel 200 or the color conversion layer 270 may include at least one color conversion region to convert an emission spectrum of light supplied from the light emitting panel 100 into light of a different emission spectrum. The color conversion region may, for example, convert light in the emission spectrum supplied from the light emitting panel 100 into light in the emission spectrum of the color displayed by each of the sub-pixels $PX_1$, $PX_2$, and $PX_3$. In an embodiment, the color conversion panel 200 may include the upper substrate 210, the light blocking pattern 220, the color filter layer 230, the planarization layer 240, the bank 250 (250*a* and 250*b*), the color conversion layer 270 (270*a*, 270*b*, and 270*c*), and the encapsulation layer 290.

In an embodiment, the luminescent nanostructures included in the first composite may include a first semiconductor nanocrystal including a Group III-V compound and a second semiconductor nanocrystal including a zinc chalcogenide. The nanostructures (or each of them) may have a core shell structure including a core and a shell disposed on the core. The core may include the first semiconductor nanocrystal. The shell may include the second semiconductor nanocrystal. The luminescent nanostructures may not include cadmium. The luminescent nanostructures may not include cadmium, lead, mercury, or a combination thereof. In an embodiment, the luminescent nanostructure(s) may have a size (or an average size) of less than or equal to about 8.5 nm.

The Group III-V compound may include indium and phosphorus. The Group III-V compound may include an indium phosphide. The first semiconductor nanocrystal or the core may be an emissive center of the luminescent nanostructure. A size of the first semiconductor nanocrystal or the core may be selected taking into account a desired maximum luminescent peak wavelength of the luminescent nanostructure. In an embodiment, the first semiconductor nanocrystal or the core may have a size (or an average size) of greater than or equal to about 1 nm, greater than or equal to about 1.5 nm, greater than or equal to about 2 nm, greater than or equal to about 2.5 nm, greater than or equal to about 2.8 nm, greater than or equal to about 3 nm, or greater than or equal to about 3.5 nm. In an embodiment, the first semiconductor nanocrystal or the core may have a size (or an average size) of less than or equal to about 5 nm, less than or equal to about 4.5 nm, less than or equal to about 4 nm, less than or equal to about 3.8 nm, or less than or equal to about 3.5 nm.

In an embodiment, the nanostructure may include a second semiconductor nanocrystal including a zinc chalcogenide. The zinc chalcogenide may include zinc, selenium, and sulfur. The second semiconductor nanocrystal may form a shell of the luminescent nanostructures disposed on the first semiconductor nanocrystal (or a core including the same). In an embodiment, the second semiconductor nanocrystal or the shell including the same may be a multi-layered shell including at least two shell layers wherein adjacent shell layers may have different a composition than the other. The multi-layered shell may include a first shell layer including a third semiconductor nanocrystal including zinc, selenium, and optionally sulfur; and a second shell layer being disposed on the first shell layer, the second shell layer including a fourth semiconductor nanocrystal including zinc, sulfur, and optionally selenium. A composition of the third semiconductor nanocrystal may be different from a composition of the fourth semiconductor nanocrystal.

The second shell layer may include sulfur in a greater amount (e.g., mole) than the first shell layer. The first shell layer may include ZnSe, ZnSeS, or a combination thereof. The first shell layer may not include sulfur. The second shell layer may include ZnS, ZnSeS, or a combination thereof. The second shell layer may not include selenium. The first shell layer may be disposed on (e.g., directly on) the semiconductor nanocrystal core. The second shell layer may be disposed (e.g., directly on) the first shell layer. The second shell layer may be an outermost layer of the luminescent nanostructure.

The plurality of the luminescent nanostructures may be configured to emit red light. A maximum peak wavelength of the red light or a photoluminescent peak wavelength of the quantum dots may be greater than or equal to about 600 nm, greater than or equal to about 610 nm, greater than or equal to about 615 nm, greater than or equal to about 620 nm, greater than or equal to about 625 nm, greater than or equal to about 630 nm, or greater than or equal to about 635 nm. A maximum peak wavelength of the red light or a photoluminescent peak wavelength of the quantum dots may be less than or equal to about 670 nm, less than or equal to about 660 nm, less than or equal to about 650 nm, less than or equal to about 645 nm, or less than or equal to about 640 nm.

As used herein, the term "quantum dot" or "luminescent nanostructure" may be used interchangeably and refer to a single entity or a plurality of particles.

In an embodiment, a plurality of the luminescent nanostructures may include a mole ratio of zinc to indium (Zn:In) that is greater than or equal to about 7.5:1, greater than or equal to about 7.8:1, greater than or equal to about 7.9:1, greater than or equal to about 10:1, greater than or equal to about 10.2:1, or greater than or equal to about 11:1 and less than or equal to about 20:1, less than or equal to about 15:1, less than or equal to about 13:1, less than or equal to about 12.5:1, less than or equal to about 12.4:1, less than or equal to about 11.5:1, or less than or equal to about 10.2:1.

In an embodiment, a plurality of the luminescent nanostructures may include a mole ratio of sulfur to indium (S:In) that is greater than or equal to about 1.5:1, greater than or equal to about 1.6:1, greater than or equal to about 3:1, greater than or equal to about 3.2:1, or greater than or equal to about 4:1 and less than or equal to about 6:1, less than or equal to about 5.6:1, less than or equal to about 5.5:1, less than or equal to about 5:1, or less than or equal to about 4.5:1.

In an embodiment, a plurality of the luminescent nanostructures may include a mole ratio of sulfur to selenium (S:Se) that is greater than or equal to about 0.5:1, greater than or equal to about 0.55:1, or greater than or equal to about 0.69:1 (or greater than or equal to about 0.72:1, greater than or equal to about 0.75:1, or greater than or equal to about 0.83:1) and less than or equal to about 1.1:1, less than or equal to about 1.05:1, less than or equal to about 0.9:1, less than or equal to about 0.89:1, less than or equal to about 0.85:1, or less than or equal to about 0.78:1.

In an embodiment, a plurality of the luminescent nanostructures may include a mole ratio of sulfur to indium (S:In) that may be greater than or equal to about 1.5:1, greater than or equal to about 1.6:1, greater than or equal to about 3:1, greater than or equal to about 3.2:1, greater than or equal to about 3.4:1, greater than or equal to about 3.6:1, greater than or equal to about 3.8:1, greater than or equal to about 4:1, greater than or equal to about 4.1:1, greater than or equal to about 4.2:1, greater than or equal to about 4.3:1, greater than or equal to about 4.4:1, greater than or equal to about 4.5:1, or greater than or equal to about 4.6:1.

In the plurality of the luminescent nanostructures, a mole ratio of sulfur to indium may be less than or equal to about 6:1, less than or equal to about 5.9:1, less than or equal to about 5.8:1, less than or equal to about 5.7:1, less than or equal to about 5.6:1, less than or equal to about 5.5:1, less than or equal to about 5.4:1, less than or equal to about 5.3:1, less than or equal to about 5.2:1, less than or equal to about 5.1:1, less than or equal to about 5:1, less than or equal to about 4.9:1, less than or equal to about 4.8:1, or less than or equal to about 4.7.

In the plurality of the luminescent nanostructures, a mole ratio of sulfur to selenium (S:Se) may be less than or equal to about 1.1:1, less than or equal to about 1.05:1, less than or equal to about 1.02:1, less than or equal to about 0.895:1, less than or equal to about 0.89:1, less than or equal to about 0.885:1, less than or equal to about 0.88:1, less than or equal to about 0.875:1, or less than or equal to about 0.87:1. In the plurality of the luminescent nanostructures, a mole ratio of sulfur to selenium (S:Se) may be greater than or equal to about 0.69:1, greater than or equal to about 0.695:1, greater than or equal to about 0.70:1, greater than or equal to about 0.705:1, greater than or equal to about 0.71:1, greater than or equal to about 0.715:1, greater than or equal to about 0.72:1, greater than or equal to about 0.725:1, greater than or equal to about 0.73:1, greater than or equal to about 0.735:1, greater than or equal to about 0.74:1, greater than or equal to about 0.745:1, greater than or equal to about 0.75:1, greater than or equal to about 0.755:1, greater than or equal to about 0.76:1, greater than or equal to about 0.77:1, greater than or equal to about 0.78:1, greater than or equal to about 0.79:1, greater than or equal to about 0.8:1, greater than or equal to about 0.81:1, greater than or equal to about 0.82:1, or greater than or equal to about 0.83:1.

In the plurality of the luminescent nanostructures, a mole ratio of zinc to indium (Zn:In) may be greater than or equal to about 7:1, greater than or equal to about 7.5:1, greater than or equal to about 7.8:1, greater than or equal to about 8:1, greater than or equal to about 9:1, greater than or equal to about 10:1, greater than or equal to about 10.1:1, greater than or equal to about 10.2:1, greater than or equal to about 10.3:1, greater than or equal to about 10.4:1, greater than or equal to about 10.5:1, greater than or equal to about 10.6:1, greater than or equal to about 10.7:1, greater than or equal to about 10.8:1, greater than or equal to about 10.9:1, greater than or equal to about 11:1, greater than or equal to about 11.1:1, greater than or equal to about 11.2:1, greater than or equal to about 11.3:1, greater than or equal to about 11.4:1, or greater than or equal to about 11.5:1. In the plurality of the luminescent nanostructures, a mole ratio of zinc to indium (Zn:In) may be less than or equal to about 20:1, less than or equal to about 15:1, less than or equal to about 14:1, less than or equal to about 13.5:1, less than or equal to about 13:1, less than or equal to about 12.5:1, less than or equal to about 12.4:1, less than or equal to about 12.3:1, less than or equal to about 12.2:1, less than or equal to about 12.1:1, less than or equal to about 12:1, less than or equal to about 11.9:1, or less than or equal to about 11.8:1.

In the plurality of the luminescent nanostructures, a mole ratio of a sum of sulfur and selenium to indium ((S+Se):In) may be greater than or equal to about 4:1, greater than or equal to about 4.3:1, greater than or equal to about 4.4:1, greater than or equal to about 5:1, greater than or equal to about 6:1, greater than or equal to about 7:1, greater than or equal to about 8:1, greater than or equal to about 8.96:1, greater than or equal to about 9.1:1, or greater than or equal to about 9.6:1. In the plurality of the luminescent nanostructures, a mole ratio of a sum of sulfur and selenium to indium ((S+Se):In) may be less than or equal to about 11:1, less than or equal to about 10.9:1, less than or equal to about 10.5:1, less than or equal to about 10.3:1, or less than or equal to about 10.25:1.

In the plurality of the luminescent nanostructures, a mole ratio of a sum of sulfur and selenium to indium ((S+Se):In) may be greater than or equal to about 4:1, greater than or equal to about 4.4:1, greater than or equal to about 5:1, greater than or equal to about 5.4:1, greater than or equal to about 6:1, greater than or equal to about 6.4:1, greater than or equal to about 7:1, greater than or equal to about 7.5:1, greater than or equal to about 8:1, greater than or equal to about 8.5:1, greater than or equal to about 8.96:1, greater than or equal to about 9.1:1, greater than or equal to about 9.2:1, greater than or equal to about 9.3:1, greater than or equal to about 9.4:1, greater than or equal to about 9.5:1, greater than or equal to about 9.6:1, greater than or equal to about 9.65:1, greater than or equal to about 9.7:1, greater than or equal to about 9.8:1, greater than or equal to about 9.9:1, greater than or equal to about 10:1, greater than or equal to about 10.1:1, or greater than or equal to about 10.2:1. In the plurality of the luminescent nanostructures, a mole ratio of a sum of sulfur and selenium to indium ((S+Se):In) may be less than or equal to about 11:1, less than or equal to about 10.8:1, less than or equal to about 10.5:1, less than or equal to about 10.3:1, or less than or equal to about 10.25:1.

In the plurality of the luminescent nanostructures, a mole ratio of selenium to indium (Se:In) may be greater than or equal to about 2.8:1, greater than or equal to about 3:1, greater than or equal to about 4:1, greater than or equal to about 5:1, greater than or equal to about 5.1:1, greater than or equal to about 5.2:1, greater than or equal to about 5.3:1, or greater than or equal to about 5.4:1. In the plurality of the luminescent nanostructures, a mole ratio of selenium to indium (Se:In) may be less than or equal to about 13:1, less than or equal to about 12:1, less than or equal to about 10:1, less than or equal to about 9:1, less than or equal to about 8:1, less than or equal to about 7:1, less than or equal to about 6.5:1, less than or equal to about 6.1:1, less than or equal to about 6:1, less than or equal to about 5.9:1, less than or equal to about 5.8:1, less than or equal to about 5.7:1, or less than or equal to about 5.6:1.

In the plurality of the luminescent nanostructures, a mole ratio of indium to a sum of sulfur and selenium (In:(S+Se)) may be greater than or equal to about 0.09:1, greater than or equal to about 0.095:1, greater than or equal to about 0.097:1, or greater than or equal to about 0.0975:1. In the plurality of the luminescent nanostructures, a mole ratio of indium to a sum of sulfur and selenium (In:(S+Se)) may be less than or equal to about 0.12:1, less than or equal to about 0.115:1, less than or equal to about 0.113:1, less than or equal to about 0.111:1, less than or equal to about 0.11:1, or less than or equal to about 0.109:1.

In the plurality of the luminescent nanostructures, a mole ratio of indium to a sum of sulfur and selenium (In:(S+Se)) may be greater than or equal to about 0.05:1, greater than or equal to about 0.06:1, greater than or equal to about 0.07:1, greater than or equal to about 0.08:1, greater than or equal to about 0.09:1, or greater than or equal to about 0.096:1. In the plurality of the luminescent nanostructures, a mole ratio of indium to a sum of sulfur and selenium (In:(S+Se)) may be less than or equal to about 0.7:1, less than or equal to about 0.65:1, less than or equal to about 0.5:1, less than or equal to about 0.4:1, less than or equal to about 0.35:1, less than or equal to about 0.3:1, less than or equal to about 0.23:1, less than or equal to about 0.2:1, or less than or equal to about 0.109:1.

In an embodiment, a thickness of the shell of the quantum dot(s) or a nominal thickness thereof (hereinafter, simply referred to as "shell thickness" at times) may be greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, or greater than or equal to about 2.1 nm. In an embodiment, the shell thickness may be less than or equal to about 2.5 nm, less than or equal to about 2.4 nm, less than or equal to about 2.3 nm, less than or equal to about 2.2 nm, less than or equal to about 2.1 nm, less than or equal to about 2 nm, less than or equal to about 1.9 nm, less than or equal to about 1.8 nm, less than or equal to about 1.7 nm, or less than or equal to about 1.6 nm.

In an embodiment, a shell may be a multi-layered shell including a first shell layer and a second shell layer, and a thickness of the first shell layer (e.g., an average thickness or a nominal thickness thereof) may be greater than or equal to about 3 monolayers (ML), for example, greater than or equal to about 3.5 ML, greater than or equal to about 3.6 ML, greater than or equal to about 3.7 ML, greater than or equal to about 3.8 ML, greater than or equal to about 3.9 ML, greater than or equal to about 4 ML, greater than or equal to about 4.1 ML, greater than or equal to about 4.2 ML, greater than or equal to about 4.3 ML, or greater than or equal to about 4.4 ML.

The thickness of the first shell layer may be less than or equal to about 7 ML, less than or equal to about 6 ML, or less than or equal to about 5 ML. In an embodiment, the thickness of the first shell layer may be greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.43 nm, or greater than or equal to about 1.45 nm. In an embodiment, the thickness of the first shell layer may be less than or equal to about 1.8 nm, less than or equal to about 1.75 nm, less than or equal to about 1.7 nm, less than or equal to about 1.6 nm, less than or equal to about 1.55 nm, or less than or equal to about 1.51 nm.

In an embodiment, a thickness of the second shell layer (e.g., an average thickness or a nominal thickness) may be less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, or less than or equal to about 0.59 nm. In an embodiment, a thickness of the second shell layer may be greater than or equal to about 0.3 nm, greater than or equal to about 0.35 nm, greater than or equal to about 0.4 nm, greater than or equal to about 0.45 nm, greater than or equal to about 0.5 nm, greater than or equal to about 0.51 nm, greater than or equal to about 0.52 nm, greater than or equal to about 0.53 nm, or greater than or equal to about 0.54 nm.

In an embodiment, a UV-Vis absorption spectrum of the luminescent nanostructures may have a first absorption peak in a range of greater than or equal to about 580 nm, greater than or equal to about 590 nm, or greater than or equal to about 600 nm and less than or equal to about 630 nm, less than or equal to about 625 nm, less than or equal to about 620 nm, less than or equal to about 615 nm, less than or equal to about 610 nm, or less than or equal to about 606 nm.

In an embodiment, in a UV-Vis absorption spectrum of the luminescent nanostructures, an absorbance ratio at a wavelength of about 520 nm to a wavelength of about 350 nm (hereinafter, A520:A350) may be greater than or equal to about 0.04:1. In an embodiment, the A520:A350 may be 0.041:1, greater than or equal to about 0.042:1, greater than or equal to about 0.043:1, greater than or equal to about 0.044:1, greater than or equal to about 0.045:1, greater than or equal to about 0.046:1, greater than or equal to about 0.047:1, greater than or equal to about 0.048:1, greater than or equal to about 0.049:1, greater than or equal to about 0.050:1, greater than or equal to about 0.055:1, or greater than or equal to about 0.060:1. In an embodiment, the A520:A350 may be less than or equal to about 0.5:1, less than or equal to about 0.3:1, or less than or equal to about 0.1:1. Without wishing to be bound by any theory, it is believed that by having the aforementioned range of the A520:A350 absorbance ratio, the luminescent nanostructures of an embodiment may exhibit more enhanced absorption for light in a green wavelength region (for example, a wavelength range of from about 520 nm to about 540 nm) in comparison to blue light, whereby in a display panel using the mixed light as a light source, the luminescent nanostructures may emit red light with more improved luminous efficiency. In a display panel of an embodiment, an incident light absorption by the color conversion panel may be greater than or equal to about 80%, greater than or equal to about 81%, greater than or equal to about 82%, greater than or equal to about 83%, greater than or equal to about 84%, or greater than or equal to about 85%.

Figure 7:
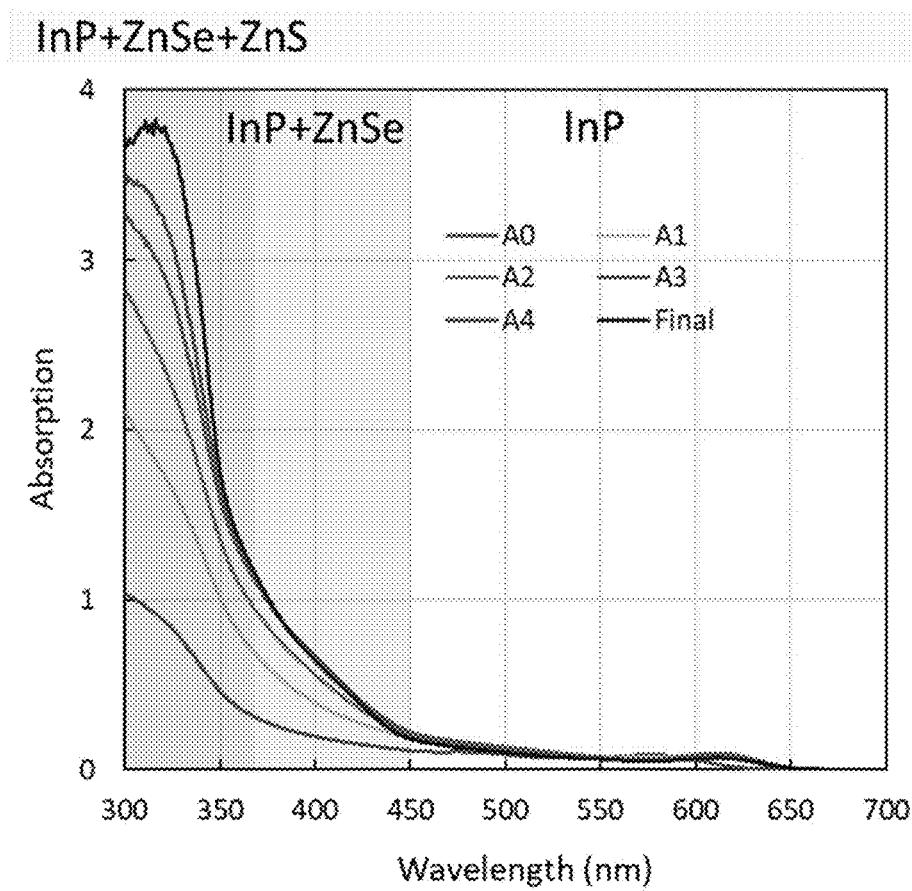
FIG. 7 is a plot of UV-Vis Absorption spectra of embodied luminescent nanostructures and a comparative example.

The present inventors have found that if the luminescent nanostructures include an indium phosphide based first semiconductor nanocrystal and a zinc chalcogenide based second semiconductor nanocrystal (e.g., disposed on the first semiconductor nanocrystal) and are configured to emit red light, the luminescent nanostructures may exhibit a UV-Vis absorption spectrum that varies with the size of the nanostructures. FIG. 7 is a plot of UV-Vis absorption curves for luminescent nanostructures with different thickness values of the second semiconductor nanocrystal (shell thickness). Referring to FIG. 7, the curve denoted as A0 is the UV-Vis absorption curve for the luminescent nanostructures of the first semiconductor nanocrystal and the curves each denoted as A1 to A4 and Final are for the luminescent nanostructures each having an increased thickness of the second semiconductor nanocrystal disposed on the first semiconductor nanocrystal. The present inventors have found that in the UV-Vis absorption spectrum, a region greater than or equal to about 450 nm may represent the absorption by the first semiconductor nanocrystal and a region less than about 450 nm may represent a dead volume (i.e., a volume portion) that may not contribute to absorption for any given luminescent nanostructure. In an embodiment, the luminescent nanostructures may have the aforementioned value of the A520/A350 absorbance ratio in their UV-Vis absorption spectrum, thereby minimizing the dead volume in the nanostructure and increasing a relative volume of the core contributing to the absorption. In addition, the red light emitting nanostructures of an embodiment having the features recited herein may provide a relatively increased level of a shell barrier, and thus, in the luminescent nanostructures of the embodiment, electron-hole orbital overlap may also increase.

In an embodiment, a size (e.g., an average size) of the luminescent nanostructure(s) may be greater than or equal to about 6 nm, greater than or equal to about 6.2 nm, greater than or equal to about 6.5 nm, greater than or equal to about 6.8 nm, greater than or equal to about 7.5 nm, greater than or equal to about 7.6 nm, or greater than or equal to about 7.7 nm. In an embodiment, a size (e.g., an average size) of the quantum dot(s) may be less than or equal to about 9 nm, less than or equal to about 8.5 nm, less than or equal to about 8 nm, less than or equal to about 7.9 nm, or less than or equal to about 7.8 nm.

The size (or the average size) of the luminescent nanostructure may be obtained from an electron microscopy image. The size (or the average size) may be a diameter or an equivalent diameter (or an average diameter value) obtained from the electron microscopy image. In an embodiment, the size (or the average size) of the luminescent nanostructure(s) may be a nominal (calculated) size that can be calculated from a compositional analysis and a measurement of optical properties (e.g., a UV-absorption peak wavelength) of a given quantum dot population. The nominal size may be calculated for a given quantum dot population from the core size and the shell thickness information obtained from the compositional analysis of the luminescent nanostructure population. The compositional analysis of the luminescent nanostructure may be made for example by using an appropriate analysis tool such as an inductively coupled plasma atomic emission spectroscopy.

The core size may be determined from a core composition of the quantum dots and an optical property (e.g., an UV absorption wavelength such as a first absorption peak wavelength). In an embodiment, for a given quantum dot, the size of the core is determined by a method using the composition of the core and an UV-visible absorption wavelength. The method of measurement is described in Nanotechnology 24 (2013) 215201 (5 pp), the entire content of which is herein incorporated by reference.

In an embodiment, if a given luminescent nanostructure includes a core of an indium phosphide, a bandgap energy thereof is greater than or equal to about 2 electron Volts (eV) and less than or equal to about 4.8 eV, and a core size may be determined in a range of greater than or equal to about 1 nm and less than or equal to about 4.5 nm. In an embodiment, quantum dots having indium phosphide-based cores may have a UV absorption wavelength (e.g., the first absorption peak wavelength) of about 570 nm, the size of the core may be determined to be from about 3.5 nm to about 3.7 nm (or about 3.6 nm).

Under the assumption that a given quantum dot has a spherical shape, a shell thickness for the quantum dots may be arithmetically determined by using the following information together with the measured mole ratios of the chalcogen elements (e.g., sulfur and selenium) with respect to indium in the quantum dots:

A core size (i.e., a core diameter) and a volume of the core calculated from the core diameter; a bulk density and a molar mass of the core component (e.g., a bulk density of the indium phosphide=4.81 grams per cubic centimeter (g/cm$^3$) and a molar mass of InP=145.79 grams per mole (g/mol)); a mole number of the indium included in a given core, which is calculated from the bulk density and the molar mass of the core component; a shell volume if a ZnS or ZnSe shell having a predetermined thickness is formed on the core; and a bulk density and a molar mass of each of the shell components (for example, ZnS, ZnSe, or a combination thereof) (for example, ZnSe=5.27 g/cm$^3$ and 144.35 g/mol, ZnS=4.090 g/cm$^3$ and 97.474 g/mol).

Under an assumption of that the quantum dot is in the form of a sphere, a mole ratio of each of the chalcogen element components (for example, sulfur or selenium) of the chalcogenide shell having a predetermined thickness with respect to indium in the core having a predetermined diameter may be calculated, from which, information about a shell thickness for a given core diameter may be determined.

In an embodiment, the semiconductor nanocrystal core may include InP or InZnP. A size (or an average size) of the core(s) or a nominal size of the cores (hereinafter, simply referred to as "core size" at times) of the quantum dot(s) may be greater than or equal to about 1 nm, greater than or equal to about 1.5 nm, greater than or equal to about 2 nm, greater than or equal to about 3 nm, greater than or equal to about 3.3 nm, or greater than or equal to about 3.5 nm. In an embodiment, the core size may be less than or equal to about 5 nm, less than or equal to about 4 nm, less than or equal to about 3.8 nm, or less than or equal to about 3.7 nm.

In an embodiment, the first composite is in a form of film (e.g., a patterned film) and the film of the quantum dot composite may have a thickness of less than or equal to about 30 micrometer (μm), for example, less than or equal to about 25 μm, less than or equal to about 20 μm, less than or equal to about 15 μm, less than or equal to about 10 μm, less than or equal to about 8 μm, or less than or equal to about 7 μm and greater than about 2 μm, for example, greater than or equal to about 3 μm, greater than or equal to about 3.5 μm, greater than or equal to about 4 μm, greater than or equal to about 5 µm, or greater than or equal to about 6 µm. In an embodiment, the first (polymer) composite may be in a form a film having a thickness of greater than or equal to about 6 µm (e.g., about 10 µm) with an amount of the quantum dots of less than or equal to about 45%.

The first composite or the film thereof may exhibit light absorption to blue light that is greater than or equal to about 88%, greater than or equal to about 90%, greater than or equal to about 91%, greater than or equal to about 92%, or greater than or equal to about 93%. In an embodiment, the blue light absorption of the composite may be from about 90% to about 99%, from about 91% to about 98%, from about 93% to about 96%, or a combination thereof.

The first composite or the film thereof may exhibit light absorption to green light that is greater than or equal to about 74%, greater than or equal to about 75%, greater than or equal to about 76%, greater than or equal to about 77%, greater than or equal to about 78%, or greater than or equal to about 80%. In an embodiment, the green light absorption of the composite may be from about 74% to about 85%, from about 76% to about 84%, or from about 78% to about 82%, or any one range derived from the stated percent values.

The first composite or the film thereof may exhibit light absorption of green and blue mixed light that is greater than or equal to about 82%, greater than or equal to about 84%, greater than or equal to about 86%, greater than or equal to about 88%, or greater than or equal to about 90%. In an embodiment, the green and blue mixed light absorption of the composite may be from about 82% to about 95%, from about 84% to about 90%, from about 85% to about 89%, or any one range derived from the stated percent values.

A shape of the luminescent nanostructures is not particularly limited, and may for example be a spherical, polyhedron, pyramid, multi-pod, or cube shape, nanotube, nanowire, nanofiber, nanosheet, or a combination thereof, but is not limited thereto.

The luminescent nanostructures may include an organic ligand, an organic solvent, or a combination thereof, which will be described herein, on a surface of the luminescent nanostructure. The organic ligand, the organic solvent, or a combination thereof may be bound to the surface of the luminescent nanostructure.

In an embodiment, the luminescent nanostructures (e.g., included in the first composite of an embodiment) may be prepared by a method, which includes:

vacuum-treating, e.g., subjecting to vacuum conditions, a solution including a zinc compound, an organic ligand, and an organic solvent under a controlled state (i.e., under a condition where oxidation may be substantially suppressed or prevented), and optionally, carrying out a ligand reaction to prepare a reaction medium including a zinc precursor;

heating the reaction medium at a first temperature and adding a first semiconductor nanocrystal including indium and phosphorus (or a particle including the same) to obtain a first mixture;

heating the first mixture at a second temperature and adding a selenium precursor, and optionally, a zinc precursor to conduct a reaction to obtain a second mixture; and maintaining a temperature of the second mixture at a second temperature and adding a sulfur precursor, and optionally, a zinc precursor to carry out a reaction to form the luminescent nanostructures.

The method may further include adding an additional selenium precursor, and optionally, a zinc precursor to the second mixture.

In the method of an embodiment, the addition of the sulfur precursor may be performed with a single addition at a necessary amount to obtain a desired quantum dot composition. In the method of an embodiment, the addition of the sulfur precursor may be performed with separate multiple additions (i.e., at least two separate additions or at least three separate additions) to provide a necessary amount to obtain a desired quantum dot composition.

The present inventors have found that during the preparation of the zinc precursor, it may be difficult to completely avoid oxidation and the consequent decomposition of the zinc compound and the organic ligand even if the preparation process is conducted under a condition of strictly controlling the presence of oxygen (e.g., under a vacuum or a nitrogen atmosphere). In the method of producing the quantum dots of an embodiment, the zinc precursor may be prepared under a controlled state, e.g., under a condition where, a side reaction such as an oxidation can be minimized, and a quality of the shell coating on the core may be improved.

The present inventors have found that during the vacuum treating of the compound, the amount of the zinc compound and the treating time with the ligand under the reaction conditions that will be described herein may affect the activity of the zinc precursor during the shell formation reaction. In the method of an embodiment, the amount of the zinc compound to be vacuum-treated may be increased, and the period of time of the vacuum treating may be controlled (or limited), and then, under a nitrogen atmosphere, a post thermal treatment may be carried out at a temperature higher than the temperature of the vacuum treating for a controlled time. As a result, the activity of the zinc precursor may be increased to form a shell coating with an improved quality.

In an embodiment, an amount of the zinc compound (e.g., zinc acetate) may be greater than or equal to about 3 millimoles (mmol), greater than or equal to about 5 mmol, greater than or equal to about 7 mmol, greater than or equal to about 9 mmol, greater than or equal to about 15 mmol, greater than or equal to about 20 mmol, or greater than or equal to about 50 mmol. The duration of the vacuum treating may be less than or about 50 minutes, less than or equal to about 45 minutes, less than or equal to about 40 minutes, less than or equal to about 30 minutes, less than or equal to about 25 minutes, or less than or equal to about 20 minutes. A temperature of the vacuum treating may be dependent on the amount of the precursor and may be greater than or equal to about 100° C., greater than or equal to about 110° C., greater than or equal to about 120° C., or greater than or equal to about 150° C. and less than or equal to about 200° C., or less than or equal to about 180° C.

During the ligand reaction, the zinc compound may react with the ligand to provide a zinc precursor that is different from the initial zinc compound added to the reaction vessel. The temperature of the ligand reaction may be selected taking into consideration the type of the initial zinc compound and the organic ligand. The ligand reaction may be carried out under an inert gas atmosphere, and a temperature of the ligand reaction may be greater than or equal to about 250° C., greater than or equal to about 270° C., or greater than or equal to about 280° C. and less than or equal to about 300° C., less than or equal to about 290° C., less than or equal to about 280° C., less than or equal to about 270° C., less than or equal to about 250° C., or less than or equal to about 240° C. The time for the ligand reaction may be greater than or equal to about 5 minutes, greater than or equal to about 10 minutes, greater than or equal to about 20 minutes, greater than or equal to about 30 minutes and less than or equal to about 40 minutes, less than or equal to about 30 minutes, less than or equal to about 25 minutes, less than or equal to about 10 minutes.

The first temperature (for adding the first semiconductor nanocrystal particle) may be greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 330° C., less than or equal to about 320° C., less than or equal to about 310° C., less than or equal to about 300° C., or less than or equal to about 290° C.

In the method of an embodiment, the second temperature (for adding the selenium precursor) may be greater than or equal to about 300° C., greater than or equal to about 310° C., greater than or equal to about 320° C., greater than or equal to about 340° C., or greater than or equal to about 345° C. The second temperature may be less than or equal to about 380° C., less than or equal to about 370° C., less than or equal to about 360° C., or less than or equal to about 350° C.

On the addition of the sulfur precursor, and optionally, the zinc precursor, the reaction medium may or may not include the selenium precursor. The addition of the sulfur precursor, and optionally, the zinc precursor, may not include decreasing a temperature of the reaction medium under a temperature of less than or equal to about 50° C. (e.g., a temperature of less than or equal to about 30° C.) or to room temperature.

Without wishing to be bound by any theory, according to the method of an embodiment, the zinc precursor, which is prepared in the aforementioned process of suppressing or controlling oxidation of the zinc, may come in contact with the selenium precursor at a temperature within the aforementioned range, and the quality of the coating including the zinc selenide may be further improved. Accordingly, even with a relatively thin shell formed on the core, the resulting quantum dots may exhibit a substantially decreased tail emission in the green light region.

The reaction time for each step (e.g., for forming each of the first shell layer or the second shell layer) may be controlled taking into consideration the type of the precursor, and the composition and the structure of the final quantum dots. In each step, the reaction time (the first time and the second time) may be each independently greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes. In each step, the reaction time (the first time and the second time) may be each independently less than or equal to about 4 hours, less than or equal to about 3 hours, or less than or equal to about 2 hours.

In the reaction medium, a concentration of the zinc precursor may not particularly limited and selected appropriately.

In the reaction (or in the first mixture, the second mixture, or each of the first mixture and the second mixture), the amounts of the zinc precursor, the selenium precursor, and the sulfur precursor with respect to the indium and the total amount used during the formation of the shell may be controlled to obtain desired compositional ratios of the elements in the final quantum dots. In each step of the process, the reaction time may be controlled to obtain desired compositional ratios of the elements and the structures (e.g., a core and multi-shell structure) in the final quantum dots.

The mole amount of selenium, which is derived from a selenium precursor, per one mole of indium in the method or in the second mixture may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, or greater than or equal to about 12 moles. The mole amount of selenium per one mole of indium in the method or in the second mixture may be less than or equal to about 25 moles, less than or equal to about 20 moles, less than or equal to about 18 moles, less than or equal to about 15 moles, less than or equal to about 12 moles, less than or equal to about 10 moles, or less than or equal to about 9 moles, per one mole of indium.

The mole amount of sulfur, which is derived from a sulfur precursor, per one mole of indium in the method may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles, per one mole of indium. The mole amount of sulfur per one mole of indium in the method may be less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles, per one mole of indium.

In the method of an embodiment, the mole amount of zinc, which is derived from a zinc compound, per one mole of indium may be determined taking into consideration the type of the compound and the composition of the final quantum dots. In an embodiment, the mole amount of zinc per one mole of indium may be greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, or greater than or equal to about 12 moles, per one mole of indium. In an embodiment, the mole amount of zinc per one mole of indium in the method may be less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, or less than or equal to about 10 moles, per one mole of indium.

The type of the zinc compound is not particularly limited and may be selected appropriately. In an embodiment, the zinc compound may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn cyanide, a Zn hydroxide, a Zn oxide, a Zn peroxide, or a combination thereof. Examples of the zinc compound may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and the like. The zinc compound may be used alone or in a combination of two or more different compounds.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' are the same or different, and are independently a hydrogen, a C1 to C40 (or C3 to C24) aliphatic hydrocarbon group (e.g., an alkyl group, an alkenyl group, or an alkynyl group), a C6 to C40 aromatic hydrocarbon group (such as a C6 to C20 aryl group)), a polymeric organic ligand, or a combination thereof. The organic ligand may coordinate to, e.g., be bound to, the surface of the obtained nanocrystal and help the nanocrystal to be well dispersed in the solution.

In the method of an embodiment, the ligand reaction may be carried out to provide a zinc precursor, which is a reaction product between the zinc compound and the organic ligand. In an embodiment, the reaction product may be a zinc carboxylate, a product of a reaction between the zinc compound and a C8 to C40 fatty acid. The reaction medium may include an organic solvent and the organic ligand.

The organic ligand may coordinate to a surface of the prepared nanocrystal, and thus, facilitate dispersing the nanocrystal in a solution. Examples of the organic ligand may include a thiol such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; methanoic (formic) acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like); an alkylphosphonic acid such as a C5 to C20 alkylphosphonic acid; or the like), but are not limited thereto. The organic acid ligand may be used alone or as a mixture of at least two different ligand compounds.

The (organic) solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected taking into consideration precursors and organic ligands.

Details of the first semiconductor nanocrystal (hereinafter, the core) including the indium and the phosphorous are the same as set forth herein. The core may be commercially available or may be prepared in any appropriate method. The preparation of the core is not particularly limited and may be performed in any method of producing an indium phosphide-based core. In an embodiment, the core may be synthesized in a hot injection manner wherein a solution including a metal precursor (e.g., an indium precursor) and optionally a ligand is heated at a high temperature (e.g., of greater than or equal to about 200° C.) and then a phosphorous precursor is injected the heated hot solution.

The selenium precursor is not particularly limited and may be selected appropriately. Examples of the selenium precursor may include selenium-trioctyl phosphine (Se-TOP), selenium-tributyl phosphine (Se-TBP), selenium-triphenyl phosphine (Se-TPP), or a combination thereof but is not limited thereto.

The type of the sulfur precursor is not particularly limited and may be selected appropriately. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, sulfide ammonium, sodium sulfide, or a combination thereof. The sulfur precursor may be injected at least one time (e.g., at least two times).

After the reaction, a non-solvent is added into the obtained final reaction solution to facilitate precipitation of organic ligand-coordinated quantum dots that may then be separated. The non-solvent may be a polar solvent that is miscible with the solvent used in the reaction. The semiconductor nanocrystals and the quantum dots may not be dispersible in the non-solvent. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through a centrifugation, filtration, chromatography, or distillation. The separated semiconductor nanocrystals (or the first and the second semiconductor nanocrystals) may be added to a washing solvent and washed, if desired. The washing solvent is not particularly limited and may include a solvent having a similar solubility parameter to that of the organic solvent or the organic ligand, and, for example, may include an alkane such as hexane, heptane, or octane, chloroform, toluene, benzene, or the like.

The luminescent nanostructures may be dispersed in a dispersion solvent. The luminescent nanostructures may form an organic solvent dispersion. The organic solvent dispersion may not include water, an organic solvent miscible with water, or a combination thereof. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof. The first composite of an embodiment may be prepared from a composition including the aforementioned luminescent nanostructure(s), for example, via a polymerization into a solid state.

In an embodiment, a composition may include the aforementioned (e.g., a plurality of) luminescent nanostructure(s) (hereinafter, referred to as quantum dot at times); an organic solvent, a liquid vehicle, or a combination thereof; and optionally a monomer, a dispersing agent, or a combination thereof. The dispersing agent may disperse the quantum dot. The dispersing agent may include a carboxylic acid group containing compound (e.g., a monomer or a polymer). The composition may further include a (photo)polymerizable monomer having a, e.g., at least one, carbon-carbon double bond, a (photo or a thermal) initiator; or a combination thereof. The composition may be a photosensitive composition.

Details of the luminescent nanostructures in the composition are as described herein. An amount of the luminescent nanostructure(s) in the composition (or in a composite as described herein) may be appropriately adjusted taking into consideration a desirable final use (e.g., a luminescent color filter or a color conversion layer of a color conversion panel) and components of the composition (or the composite).

In an embodiment, the amount of the luminescent nanostructure may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solids content of the composition. The amount of the luminescent nanostructure may be less than or equal to about 70 wt %, for example, less than or equal to about 65 wt %, less than or equal to about 60 wt %, less than or equal to about 55 wt %, or less than or equal to about 50 wt %, based on a total weight or a total solids content of the composition.

The weight percentage of the components relative to the total solids content in the composition may represent the contents of the components in the composite, which will be described herein. In an embodiment, the quantum dot composition may not include an organic solvent (i.e., a solventless system) and an amount of a given component in the composition may correspond to the amounts of the given component in the composite.

In the composition of an embodiment, the dispersing agent may contribute to ensuring dispersity of the quantum dots or metal oxide fine particles that will be described herein. In an embodiment, the dispersing agent may be a binder (or binder polymer). The binder may include an organic compound (e.g., a monomer or a polymer) optionally including a carboxylic acid group (e.g., in the repeating unit). The dispersing agent or the binder may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

In an embodiment, the dispersing agent may include the first monomer, the second monomer, and optionally the third monomer.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the dispersing agent or the binder polymer may be less than or equal to about 35 wt %, for example less than or equal to about 33 wt %, or less than or equal to about 30 wt %, based on a total weight or a total solid content of the composition. The amount of the dispersing agent or the binder polymer may be about 0.5 wt % to about 55 wt %, based on a total weight or a total solid content of the composition.

In the composition, the polymerizable (e.g., photopolymerizable) monomer (hereinafter, may be referred to as "monomer") including the carbon-carbon double bond may include a (e.g., photopolymerizable) (meth)acryl-based, i.e., (meth)acryl-containing, monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted taking into consideration types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the composite that will be described herein) may further include a (multiple or mono-functional) thiol compound having a, e.g., at least one, thiol group at the terminal end, a metal oxide fine particle, or a combination thereof.

The metal oxide fine particle may include $TiO_2$, $SiO_2$, $BaTiO_3$, $Ba_2TiO_4$, ZnO, or a combination thereof.

In the composition, an amount of the metal oxide fine particle may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content) of the composition. The metal oxide fine particle may be non-emissive (e.g., not emitting light). The metal oxide may include an oxide of a metal or a metalloid.

The metal oxide fine particle may have an appropriately selected diameter without a particular limit. The diameter of the metal oxide fine particle may be greater than or equal to about 100 nm, for example, greater than or equal to about 150 nm, or greater than or equal to about 200 nm and less than or equal to about 1,000 nm, less than or equal to about 800 nm, less than or equal to about 500 nm, less than or equal to about 400 nm, or less than or equal to about 300 nm.

The (poly)thiol compound may be a dithiol compound, a trithiol compound, a tetrathiol compound, or a combination thereof. For example, the thiol compound may be a glycoldi-3-mercaptopropionate (e.g., ethylene glycol di-3-mercaptopropionate), glycoldimercaptoacetate (e.g., ethylene glycol dimercaptoacetate), trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the (poly)thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition. The amount of the (poly)thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, based on a total weight or a total solid content of the composition.

The composition may further include an organic solvent (or a liquid vehicle, hereinafter referred to as a solvent). Types of the usable organic solvent are not particularly limited. Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne); a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. With the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition may further include various additives such as a light diffusing agent, a leveling agent, or a coupling agent in addition to the aforementioned components. Details of the components of the composition may refer to for example, US-2017-0052444-A1, which will be incorporated herein by reference.

The composition according to an embodiment may be prepared by a method including preparing quantum dot dispersion including the aforementioned luminescent nanostructures, the dispersing agent, and the solvent; and mixing the quantum dot dispersion with the initiator, the polymerizable monomer (e.g., an acryl-based, i.e., acryl-containing, monomer), optionally, the thiol compound, optionally, the metal oxide fine particle, and optionally, the aforementioned additive. Each of the aforementioned components may be mixed sequentially or simultaneously, but mixing orders are not particularly limited.

The composition according to an embodiment may be used to provide a first composite or a pattern thereof (e.g., a patterned luminescent nanostructure polymer composite). The composition may provide a luminescent nanostructure-polymer composite by a (e.g., radical) polymerization. The composition according to an embodiment may be a photoresist composition including luminescent nanostructures applicable to a photolithography method. The composition according to an embodiment may be an ink composition that may provide a pattern by printing (e.g., a droplet discharge method such as inkjet printing).

In an embodiment, the color conversion layer or the patterned luminescent nanostructure composite film may be produced by a method using the photoresist composition. Non-limiting methods of forming the pattern are illustrated, referring to FIG. 11A. The method may include:
forming a film of the composition on a substrate (S1);
optionally prebaking the film (S2);
exposing a selected region of the film to light (e.g., a wavelength of less than or equal to about 400 nm) (S3); and
developing the exposed film with an alkali developing solution to obtain a pattern including the luminescent nanostructure-polymer composite (S4).

The composition may be coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

Figure 11A:
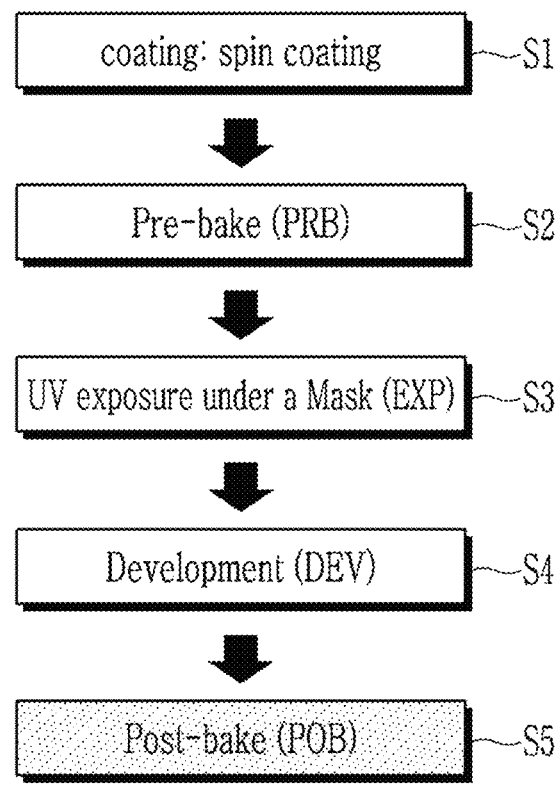
FIG. 11A schematically represents a process (e.g., a photolithography process) of producing a quantum dot composite pattern using a composition according to an embodiment.
Figure 11A:
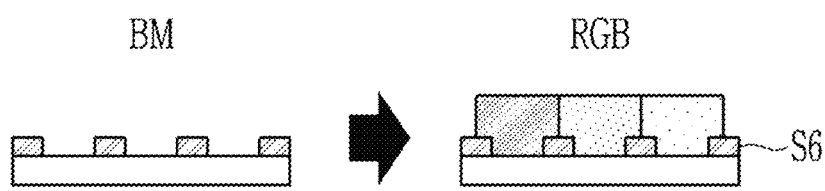

The formed (or optionally pre-baked) film is exposed to light having a predetermined wavelength under a mask (e.g., a photomask) having a predetermined pattern (S3). A wavelength and intensity of the light may be selected by taking into consideration a type of the initiator (e.g., photoinitiator), an amount of the initiator (e.g., photoinitiator), types of the quantum dots, amounts of the quantum dots, and the like. In FIG. 11A, BM denotes a black matrix.

The exposed film is treated with an alkali developing solution (e.g., dipping or spraying) to dissolve an unexposed region and obtain a desired pattern. The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the color conversion layer or the luminescent nanostructure-polymer composite pattern has a plurality of repeating sections, a composite having a desired pattern may be obtained by preparing a plurality of compositions including a luminescent nanostructure having desired a photoluminescence property (e.g., a photoluminescence peak wavelength) to form each repeating section (e.g., a red light emitting luminescent nanostructure, a green light emitting luminescent nanostructure, or optionally, a blue light emitting luminescent nanostructure). The print pattern may be repeated an appropriate number of times (e.g., two or more times or three or more times) to form the pattern (S6). For example, the luminescent nanostructure-polymer composite may have, e.g., be provided in, a pattern including at least two repeating color sections (e.g., RGB sections). The luminescent nanostructure-polymer composite pattern may be used as a photoluminescence-type color filter or a color conversion layer in a display device or a color conversion panel.

Figure 11B:
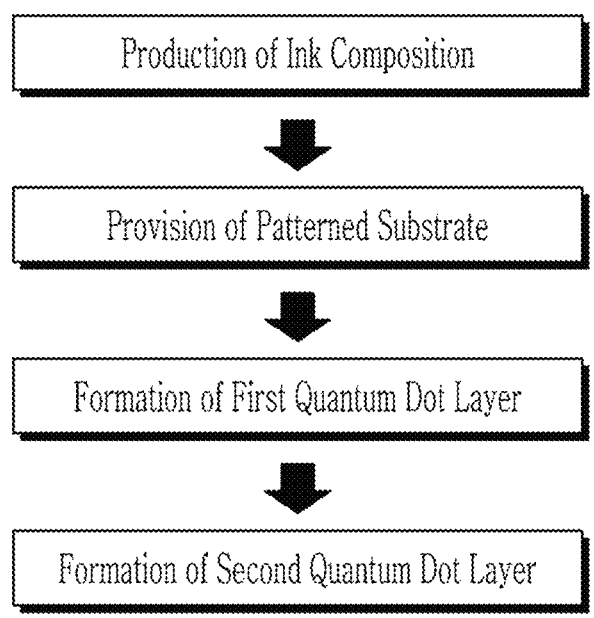
FIG. 11B schematically represents a process (e.g., an ink jet process) of producing a quantum dot composite pattern using a composition according to an embodiment.

A color conversion layer or a luminescent nanostructure composite pattern may be formed by using an ink composition configured to form a pattern via an ink jet manner. Referring to FIG. 11B, the method includes preparing an ink composition; obtaining a substrate including a pattern of, for example, an electrode and optionally a pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head). The deposited ink composition may be heated to remove a solvent and optionally to carry out a polymerization, and thus, provide a (first or second) quantum dot layer. The method may provide a highly precise luminescent nanostructure-polymer composite film or pattern in a simple (e.g., relatively cost effective) manner, and in a relatively short period of time.

In an embodiment, the first composite (e.g., a luminescent nanostructure polymer composite) includes a matrix (e.g., a polymer matrix); and the aforementioned luminescent nanostructures dispersed in the matrix. The first composite may further include the metal oxide fine particle dispersed in the matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

In the first composite of an embodiment, an amount of the plurality of luminescent nanostructures and an amount of the metal oxide fine particles are the same as set forth herein. In an embodiment, the amount of the matrix may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %, based on a total weight of the composite. In an embodiment, the amount of the matrix may be less than or equal to about 90 wt %, less than or equal to about 80 wt %, less than or equal to about 70 wt %, less than or equal to about 60 wt %, less than or equal to about 50 wt %, or less than or equal to about 40 wt %, based on a total weight of the composite. In the composite, a total amount of the quantum dots and the metal oxide fine particles may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %, based on a total weight of the composite. In the composite, a total amount of the luminescent nanostructures and the metal oxide fine particles may be less than or equal to about 90 wt %, less than or equal to about 80 wt % less than or equal to about 70 wt %, less than or equal to about 60 wt %, less than or equal to about 50 wt %, or less than or equal to about 40 wt %, based on a total weight of the composite.

The matrix may include a dispersing agent (e.g., a binder monomer or polymer including a carboxylic acid group), a polymerization product (e.g., insulating polymer) of a polymerizable monomer having a carbon-carbon double bond (a, e.g., at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof.

In an embodiment, the polymer matrix may include a crosslinked polymer, a linear polymer, or a combination thereof. The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiol groups (e.g., at a terminal end thereof). The quantum dot, the dispersing agent, or the binder polymer, the polymerizable monomer, and the polythiol compound may be the same as described herein.

In an embodiment, the color conversion panel may include the first composite, the second composite, and optionally the third composite, and on each of the composites, an incident light blocking layer, a color filter layer, or a first optical filter layer (hereinafter, referred to as "first optical filter layer") may be further disposed. The first optical filter layer may be disposed between the composite and the substrate (e.g., an upper substrate 210) or over a top face of the substrate. In an embodiment, the first optical filter layer may be a sheet having an opening in a region corresponding to a predetermined pixel area (a third region) displaying blue and thus formed in a region corresponding first and second regions. In an embodiment, the first optical filter layer 230 may be disposed at the positions except the position overlapped with the third region, but is not limited thereto. In an embodiment, two or more first optical filter layers may be disposed leaving a space at each position overlapped with the first and second regions and optionally the third region. In an embodiment, the light source includes a green light emitting element, and a green light blocking layer may be disposed on the third region, as desired.

The first optical filter layer may block (e.g., absorb) or substantially block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof. In an embodiment, the first optical filter layer transmitting blue light and blocking green light may be disposed on a blue light emitting pixel.

The first optical filter layer may substantially block excitation light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emission region, and the first optical filter layer configured to selectively transmit green light may be disposed at a position overlapped with the green light emission region. The first optical filter layer may include a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or a combination thereof. In an embodiment, the light source emits a mix of blue and green light, the first optical filter layer may further include a third region that selectively transmits blue light and blocks green light.

The first region may be disposed at a position overlapped with the red light emission region. The second region may be disposed at a position overlapped with the green light emission region. The third region may be disposed at a position overlapped with the blue light emission region.

The first region, the second region, and, optionally, the third region may be optically isolated. Such a first optical filter layer may contribute to improvement of color purity of the display device.

In an embodiment, the display panel may further include a protection layer, a second optical filter layer (e.g., a red/green or yellow light recycle layer), or a combination thereof, disposed between the color conversion panel and the light emitting panel. In an embodiment, the protection layer may include a transparent insulation material. In an embodiment, the second optical filter layer may transmit at least a portion of incident light (a third light), and reflecting a, e.g., at least a portion of the first light, at least a portion of the second light, or at least a portion of each of the first light and second light. The first light may be red light, the second light may be green light, and the third light may be blue light. In an embodiment, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be directed to the outside of the display panel.

The second optical filter layer or the first optical filter layer may be formed as an integrated layer having a relatively planar surface.

The first optical filter layer may include a polymer thin film including a dye absorbing light in a wavelength that is to be blocked, a pigment absorbing light in a wavelength that is to be blocked, or a combination thereof. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Referring to FIG. 5a, a color filter layer 230 may be positioned in a direction in which light passing through the color conversion layer 270 may be emitted. The color filter layer 230 may include color filters 230a, 230b, and 230c in each sub-pixel $PX_1$, $PX_2$, and $PX_3$ and selectively transmit light of different wavelength spectra. The color filters 230a, 230b, and 230c may selectively transmit light of each same wavelength spectrum as the color displayed in each sub-pixel $PX_1$, $PX_2$, and $PX_3$ and also, selectively transmit light of the emission spectrum converted in each region of the color conversion layer 270.

In an embodiment, the first sub-pixel $PX_1$, the second sub-pixel $PX_2$, and the third sub-pixel $PX_3$ respectively may display red, green, and blue, and when light of each red emission spectrum, green emission spectrum, and blue emission spectrum may be emitted from the first color conversion region 270a, the second color conversion region 270b, and the light transmitting region 270c, the first color filter 230a overlapped with the first color conversion region 270a may be a red filter, the second color filter 230b overlapped with the second color conversion region 270b may be a green filter, and the third color filter 230c overlapped with the light transmitting region 270c may be a blue filter. The first color filter 230a, the second color filter 230b, or the third color filter 230c may include a pigment and/or a dye to selectively transmit light of a red wavelength spectrum, a green wavelength spectrum, or a blue wavelength spectrum but absorb and/or reflect light of the other wavelength spectra.

The color filter layer 230 may more precisely filter light emitted from the color conversion layer 270, and thus, enhance color purity of the light emitted toward the upper substrate 210. For example, the first color filter 230a overlapped with the first color conversion region 270a may block (or reduce transmission of) light not converted by the first quantum dot 271a of the first color conversion region 270a, and transmit the converted light to enhance color purity of light, e.g., light with a predominantly red emission spectrum. For example, the second color filter 230b overlapped with the second color conversion region 270b may block (or reduce transmission of) light not converted by the first quantum dot 271b of the second color conversion region 270b, and transmit the converted light to enhance color purity of light, e.g., light with a predominantly green emission spectrum. For example, the third color filter 230c overlapped with the light transmitting 270c may be configured to block (or reduce transmission of) light other than light of the blue emission spectrum and, for example, enhance color purity of light with a predominantly blue emission spectrum. For example, at least some of the first, second, and third color filters 230a, 230b, and 230c may be omitted, for example, the third color filter 230c overlapped with the light transmitting region 270c may be omitted.

The light blocking pattern 220 may define each sub-pixel $PX_1$, $PX_2$, and $PX_3$ and be between the neighboring sub-pixels $PX_1$, $PX_2$, and $PX_3$. The light blocking pattern 220 may be, for example, a black matrix. The light blocking pattern 220 may be overlapped with the edges of the neighboring color filters 230a, 230b, and 230c.

The planarization layer 240 may be disposed between the color filter layer 230 and the color conversion layer 270, and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, and/or an oxynitride, for example, silicon oxide, silicon nitride, silicon oxynitride, or a combination thereof, but is not limited thereto. The planarization layer 240 may be one layer or two or more layers, and may cover the entire surface of the upper substrate 210.

The encapsulation layer 290 may cover the color conversion layer 270 and the bank 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, and/or a combination thereof, but is not limited thereto. The inorganic film may include, for example, an oxide, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one, two, or more layers.

A light transmitting layer 300 may be between the light emitting panel 100 and the color conversion panel 200. The light transmitting layer 300 may include, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

The upper substrate 210 may be a substrate including an insulation material. The substrate may include glass; various polymers such as a polyester, (e.g., polyethylene terephthalate (PET), polyethylene naphthalate (PEN), and the like), polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the upper substrate may be appropriately selected taking into consideration a substrate material but is not particularly limited. The substrate may have flexibility. The upper substrate may have a transmittance of greater than or equal to about 50%, greater than or equal to about 60%, greater than or equal to about 70%, greater than or equal to about 80%, or greater than or equal to about 90% for light emitted from the quantum dots.

The aforementioned display panel may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle. The electronic apparatus may include a photodetector including the quantum dots.

Hereinafter, the embodiments are illustrated in more detail with reference to examples. However, they are exemplary embodiments of the present invention, and the present invention is not limited thereto.

EXAMPLES

Analysis Methods
1. Ultraviolet (UV)-Visible (Vis) Absorption Analysis

An Agilent Cary5000 spectrometer is used to obtain and perform UV-Visible absorption spectrum and analysis.

From the UV-Vis absorption spectrum, an absorbance at 350 nm and an absorbance at 520 nm are measured and an absorbance ratio therebetween is measured by the following equation:

Absorbance ratio=$A520/A350$

A520: absorbance at 520 nm
A350: absorbance at 350 nm.
2. Inductively Coupled Plasma-Atomic Emission Spectroscopy (ICP-AES) Analysis An inductively coupled plasma-atomic emission spectroscopy (ICP-AES) analysis is performed using Shimadzu ICPS-8100.
3. Absorption of Incident Light Using the UV-Vis absorption spectrum of the quantum dots, a ray tracing simulation is measured for each of a Blue Oled light source, a Green Oled light source, and a Blue-Green Oled light source and the absorption is calculated according to the following equation:

Blue light absorption=$(B-B')/B$

Green light absorption=$(G-G')/G$

Blue-Green light absorption=$(BG-BG')/BG$

B, G, BG=light dose of the blue light from the blue Oled, green light from the green Oled, and the blue light and green light from the Blue-Green Oled B', G', BG'=light dose of the blue light that has passed through the composite, green light that has passed through the composite, and the blue light and green light that has passed through the composite.

Reference Example 1

Indium acetate and palmitic acid are dissolved in 1-octadecene in a 200 milliliters (mL) reaction flask, and the solution is subjected to vacuum at 120° C. for one hour. A molar ratio of indium to palmitic acid of 1:3 is used. The atmosphere in the flask is exchanged with $N_2$, and the flask is heated to 280° C. A mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture is rapidly cooled to room temperature, and acetone is added to facilitate the precipitation of nanocrystals, which are then separated by centrifugation and dispersed in toluene to obtain a toluene dispersion of the InP core nanocrystals. The amount of the $TMS_3P$ added to the reaction flask is about 0.5 moles per one mole of indium. The amount of the trioctylphosphine added to the reaction flask is about 0.1 moles to about 10 moles (e.g., about 0.5 moles) per one mole of indium. An average particle size of the InP core is about 3.6 nanometers (nm).

Preparation Example 1

Selenium and sulfur are dispersed in trioctylphosphine (TOP) to obtain a Se/TOP stock solution and a S/TOP stock solution, respectively.

In a 200 mL reaction flask, 7.2 mmol of zinc acetate and oleic acid are dissolved in trioctyl amine and the solution is subjected to vacuum at 120° C. for 30 minutes, then is heated under a nitrogen atmosphere to 280° C. for 10 minutes to prepare a reaction medium including a zinc precursor.

The reaction medium including the zinc precursor is cooled to about 180° C. and a toluene dispersion of the prepared InP semiconductor nanocrystal core is injected into the reaction medium, which is then heated to 320° C. and the Se/TOP stock solution, and optionally, an additional zinc precursor are added to the reaction flask. A reaction is carried out for about 30 minutes. Then, the S/TOP stock solution and an additional zinc precursor prepared separately in the same manner as disclosed herein are injected to the reaction mixture and a reaction is carried out for about 60 minutes and the resulting mixture is cooled rapidly to room temperature.

A total amount of each of the Se precursor, the S precursor, and the zinc precursor as used per one mole of the indium is controlled so that the final quantum dot has the composition set forth in Table 1.

An excess amount of ethanol is added to the reaction mixture including the final luminescent nanostructures (hereinafter, referred to as "quantum dot"), and the mixture is centrifuged. After centrifugation, the supernatant is discarded and the precipitate is dried and dispersed in chloroform or toluene to obtain a quantum dot solution (hereinafter, QD solution).

A UV-Vis absorption analysis and ICP-AES analysis of the prepared quantum dots is performed and the results are listed in Table 1 and Table 2.

Examples 2 to 4

Quantum dots are prepared in the same manner as in Example 1, except for changing the amounts of the zinc precursor, the selenium precursor, and the sulfur precursor per one mole of indium to obtain the composition set forth in Table 1.

A UV-Vis absorption analysis and ICP-AES analysis of the prepared quantum dots is performed and the results are listed in Table 1 and Table 2.

Comparative (Comp.) Example

Quantum dots are prepared in the same manner as in Example 1, except for preparing the zinc precursor as disclosed herein, changing the reaction temperature to 280° C., and changing the used amounts of the zinc precursors, the selenium precursors, and the sulfur precursors to obtain the quantum dots having a nominal size of 9.5 nm and having the composition of Table 1:

In a 200 mL reaction flask, 1.6 mmol of zinc acetate and oleic acid are dissolved in trioctyl amine and the solution is subjected to vacuum at 120° C. for one hour, then is heated under a nitrogen atmosphere to 280° C. for 10 minutes to prepare a reaction medium including a zinc precursor.

A UV-Vis absorption analysis and ICP-AES analysis of the prepared quantum dots is performed and the results are listed in Table 1 and Table 2.

TABLE 1

| | S/In | Zn/In | Se/In | S/Se | S + Se | ZnSe (nm) | ZnS (nm) | Nominal size |
|---|---|---|---|---|---|---|---|---|
| Example 1 | 4.44 | 11.02 | 5.53 | 0.80 | 9.98 | 1.50 | 0.55 | 7.8 |
| Example 2 | 4.75 | 12.40 | 6.13 | 0.78 | 10.88 | 1.60 | 0.56 | 8.0 |
| Example 3 | 3.25 | 10.24 | 3.17 | 1.02 | 6.42 | 1.05 | 0.53 | 6.8 |
| Example 4 | 1.60 | 7.98 | 2.84 | 0.56 | 4.44 | 0.97 | 0.30 | 6.2 |
| Comp. Ex | 5.61 | 20.29 | 13.36 | 0.42 | 18.98 | 2.49 | 0.44 | 9.5 |

TABLE 2

| | First absorption peak wavelength (nm) | A520/A350 ratio |
|---|---|---|
| Example 1 | 610 | 0.048 |
| Example 2 | 606 | 0.043 |
| Example 3 | 606 | 0.063 |
| Example 4 | 601 | 0.064 |
| Comp. Ex | 604 | 0.030 |

Experimental Example

Based on UV-Vis absorption spectrum of the quantum dots prepared in Examples 1-4 and Comp. Example, ray tracing simulation is carried out for different light source and the results are shown in FIG. 8, FIG. 9, and FIG. 10.

Figure 8:
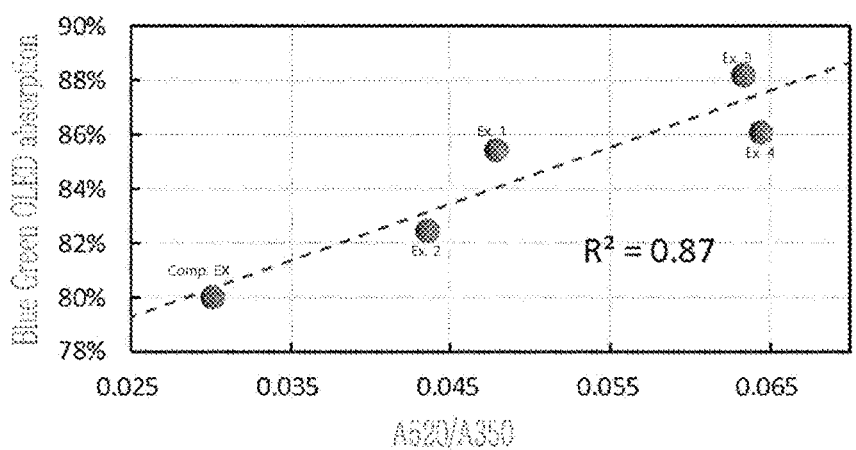
FIG. 8 is a graph showing the absorption of the composite for the incident (blue-green) light emitted from the OLED versus an absorbance ratio of the luminescent nanostructures at a wavelength of 520 nm with respect to a wavelength of 350 nm.
Figure 9:
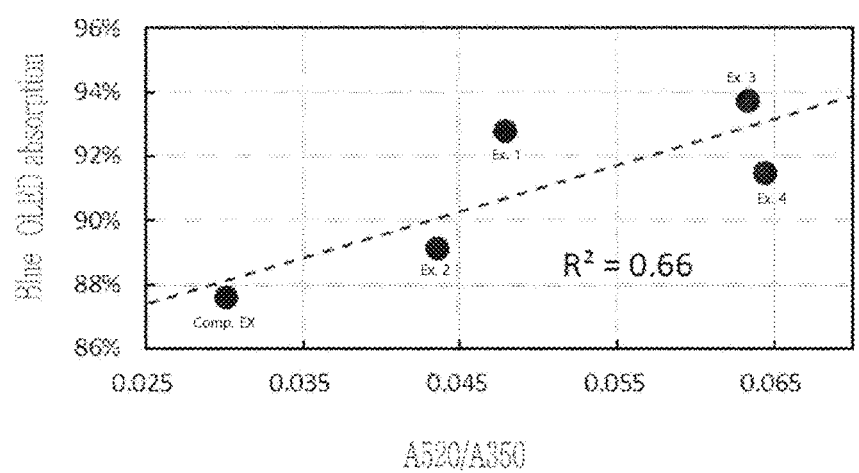
FIG. 9 is a graph showing the absorption of the composite for the first light (blue light) emitted from the OLED versus an absorbance ratio of the luminescent nanostructures at a wavelength of 520 nm with respect to a wavelength of 350 nm.
Figure 10:
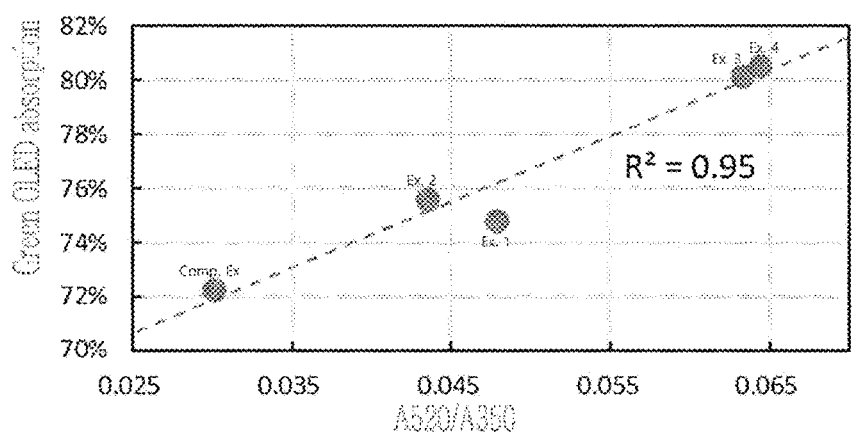
FIG. 10 is a graph showing the absorption of the composite for the second light (green light) emitted from the OLED versus an absorbance ratio of the luminescent nanostructures at a wavelength of 520 nm with respect to a wavelength of 350 nm.

The results of FIG. 8, FIG. 9, and FIG. 10 confirm that the luminescent nanostructures of the Examples having the increased A520/A350 absorbance ratio may show improved incident light absorption in comparison with the luminescent nanostructures of the comparative Example.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel comprising a light emitting panel, and a color conversion panel with a surface opposite a surface of the light emitting panel,
   wherein the light emitting panel is configured to emit incident light including a first light with a luminescent peak wavelength greater than or equal to about 450 nm and less than or equal to about 480 nm, and a second light with a luminescent peak wavelength of greater than or equal to about 500 nm and less than or equal to about 580 nm,
   wherein the color conversion panel comprises a color conversion layer comprising a color conversion region, and optionally, a partition wall defining each region of the color conversion layer,
   wherein the color conversion region comprises a first region corresponding to a red pixel, and the first region comprises a first composite comprising a matrix and a plurality of luminescent nanostructures dispersed in the matrix,
   wherein a UV-Vis absorption spectrum of the plurality of the luminescent nanostructures includes a first absorption peak in a range of greater than or equal about 580 nanometers and less than or equal to about 630 nanometers, and
   wherein in the UV-Vis absorption spectrum, an absorbance ratio at a wavelength of about 520 nm with respect to a wavelength of about 350 nm is greater than or equal to about 0.04:1.

2. The display panel of claim 1, wherein an absorbance ratio at a wavelength of about 520 nm with respect to a wavelength of about 350 nm is less than 0.1:1.

3. The display panel of claim 1, wherein the light emitting panel comprises a first electrode and a second electrode, and a light emission layer disposed between the first electrode and the second electrode, and optionally, wherein the light emission layer comprises an organic compound and a dopant.

4. The display panel of claim 2, wherein the light emission layer comprises a first emission layer, and a second emission layer disposed on the first emission layer, wherein the first emission layer is configured to emit the first light, and the second emission layer is configured to emit the second light.

5. The display panel of claim 4, wherein the light emission layer further comprises a first charge generation layer disposed between the first emission layer and the second emission layer, and optionally, a charge auxiliary layer disposed between the first electrode and the first emission layer, between the second electrode and the second emission layer, or between the first electrode and the first emission layer and between the second electrode and the second emission layer.

6. The display panel of claim 2, wherein the emission layer comprises:
   a second emission layer disposed between two first emission layers,
   a first emission layer disposed between two second emission layers, or a combination thereof, and wherein the first emission layer is configured to emit the first light and the second emission layer is configured to emit the second light.

7. The display panel of claim 1, wherein the incident light does not comprise red light having a wavelength of greater than or equal to about 600 nanometers and less than or equal to about 680 nanometers.

8. The display panel of claim 1, wherein a maximum luminescent peak wavelength of the second light is greater than or equal to about 515 nanometers and less than or equal to about 530 nanometers, or wherein a maximum luminescent peak wavelength of the first light is greater than or equal to about 455 nanometers and less than or equal to about 465 nanometers.

9. The display panel of claim 1, wherein a maximum luminescent peak wavelength of the luminescent nanostructures is greater than or equal to about 600 nanometers and less than or equal to about 660 nanometers.

10. The display panel of claim 1, wherein the absorbance ratio at a wavelength of about 520 nanometers with respect to a wavelength of about 350 nanometers is greater than or equal to about 0.045:1.

11. The display panel of claim 1, wherein the plurality of the luminescent nanostructures comprises a first semiconductor nanocrystal comprising a Group III-V compound and a second semiconductor nanocrystal comprising a zinc chalcogenide, wherein the Group III-V compound comprises indium and phosphorus, the zinc chalcogenide comprises zinc, selenium, and sulfur, and the luminescent nanostructures do not comprise cadmium.

12. The display panel of claim 1, wherein the plurality of the luminescent nanostructures comprises a mole ratio of sulfur to indium of greater than or equal to about 3 and less than or equal to about 6, and a mole ratio of sulfur to selenium of greater than or equal to about 0.69 and less than or equal to about 0.89:1.

13. The display panel of claim 1, wherein the plurality of the luminescent nanostructures comprises a mole ratio of zinc to indium of greater than or equal to about 7.9:1 and less than or equal to about 12.4:1.

14. The display panel of claim 1, wherein the luminescent nanostructures have a size of greater than or equal to about 6 nanometers and less than or equal to about 8.5 nanometers.

15. The display panel of claim 1, wherein the plurality of the luminescent nanostructures comprises a mole ratio of indium to a sum of selenium and sulfur [In/(Se+S)] of greater than or equal to about 0.09:1 and less than or equal to about 0.23:1.

16. The display panel of claim 1, wherein the first composite exhibits a light absorption for the incident light, as determined by the following equation, of greater than or equal to about 82%:

a light absorption (%)=[($BG-BG'$)/$BG$]×100(%)

BG: light dose of incident light
BG': light dose of incident light having passed through the first composite.

17. The display panel of claim 1, wherein the first composite exhibits a light absorption for the second light, as determined by the following equation, of greater than or equal to about 74%:

a light absorption (%)=[($G-G'$)/$G$]×100(%)

G: light dose of the second light
G': light dose of the second light having passed through the first composite.

18. The display panel of claim 1, wherein the first composite exhibits a light absorption for the first light, as determined by the following equation, of greater than or equal to about 88%:

a light absorption (%)=[($B-B'$)/$B$]×100(%)

B: light dose of the first light
B': light dose of the first light having passed through the first composite.

19. The display panel of claim 1, wherein the color conversion region further includes a second region corresponding to a green pixel, a third region corresponding to a blue pixel, or both the second and third regions.

20. An electronic device comprising the display panel of claim 1.

21. A display panel comprising a light emitting panel, and a color conversion layer disposed on the light emitting panel, wherein the light emitting panel is configured to emit incident light including a first light with a luminescent peak wavelength greater than or equal to about 450 nm and less than or equal to about 480 nm, and a second light with a luminescent peak wavelength of greater than or equal to about 500 nm and less than or equal to about 580 nm, wherein the light emitting panel is configured to provide the incident light to the color conversion layer, wherein the color conversion layer comprises a composite comprising a matrix and luminescent nanostructures dispersed in the matrix, wherein a maximum peak emission wavelength of the luminescent nanostructures is greater than or equal about 600 nanometers and less than or equal to about 650 nanometers, and wherein in the UV-Vis absorption spectrum, an absorbance ratio at a wavelength of about 520 nm with respect to a wavelength of about 350 nm is greater than or equal to about 0.04:1 and less than 0.1:1.

22. The display panel of claim 21, wherein the plurality of the luminescent nanostructures comprises a mole ratio of zinc to indium of greater than or equal to about 7.9:1 and less than or equal to about 12.4:1.

23. The display panel of claim 21, wherein the plurality of the luminescent nanostructures comprises a mole ratio of indium to a sum of selenium and sulfur [In/(Se+S)] of greater than or equal to about 0.09:1 and less than or equal to about 0.23:1.

24. The display panel of claim 21, wherein the color conversion layer comprise a color conversion region comprises a first region corresponding to a red pixel; and a second region corresponding to a green pixel, a third region corresponding to a blue pixel, or both the second and third regions.

25. The display panel of claim 21, wherein a UV-Vis absorption spectrum of the plurality of the luminescent nanostructures, an absorbance ratio at a wavelength of about 520 nm with respect to a wavelength of about 350 nm is from about 0.04:1 to about 0.06:1.

* * * * *